(12) United States Patent
Harada

(10) Patent No.: US 12,144,104 B2
(45) Date of Patent: Nov. 12, 2024

(54) HIGH FREQUENCY MODULE AND COMMUNICATION DEVICE

(71) Applicant: Murata Manufacturing Co., Ltd., Kyoto (JP)

(72) Inventor: Tetsuro Harada, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 189 days.

(21) Appl. No.: 17/817,383

(22) Filed: Aug. 4, 2022

(65) Prior Publication Data

US 2023/0103162 A1  Mar. 30, 2023

(30) Foreign Application Priority Data

Sep. 14, 2021 (JP) ................. 2021-149752

(51) Int. Cl.
| | |
|---|---|
| H05K 1/02 | (2006.01) |
| H01Q 5/50 | (2015.01) |
| H01Q 9/04 | (2006.01) |
| H05K 1/16 | (2006.01) |

(52) U.S. Cl.
CPC ............ H05K 1/0219 (2013.01); H01Q 5/50 (2015.01); H01Q 9/0407 (2013.01); H05K 1/165 (2013.01)

(58) Field of Classification Search
CPC ......... H05K 1/0233; H05K 1/16; H05K 1/165
See application file for complete search history.

(56) References Cited

U.S. PATENT DOCUMENTS

| | | | |
|---|---|---|---|
| 11,201,602 B1 * | 12/2021 | Oran ...................... | H03J 3/20 |
| 2014/0133117 A1 | 5/2014 | Saji et al. | |
| 2020/0235772 A1 * | 7/2020 | Naniwa ................ | H05K 1/0243 |
| 2021/0050837 A1 * | 2/2021 | Shigematsu ............ | H03H 7/09 |
| 2023/0074812 A1 * | 3/2023 | Almalkawi ............. | H03H 7/09 |

FOREIGN PATENT DOCUMENTS

| | | |
|---|---|---|
| JP | 2012-190923 A | 10/2012 |
| JP | 5234527 B2 | 4/2013 |
| JP | 5342704 B1 | 8/2013 |

* cited by examiner

*Primary Examiner* — Hoa C Nguyen
(74) *Attorney, Agent, or Firm* — Pearne & Gordon LLP

(57) ABSTRACT

A high frequency module includes a mounting substrate, an inductor, and a plurality of electronic components. The inductor is arranged on the mounting substrate. The inductor is arranged in an inside of the mounting substrate and has a winding portion formed by winding a conductor portion a plurality of times in a thickness direction of the mounting substrate. A first ground layer is formed in a region that is on an inner side of an outer edge of the winding portion in plan view of the mounting substrate, and the first ground layer is arranged closest to the winding portion in the thickness direction of the mounting substrate among ground layers formed in the region in a plurality of ground layers. The first ground layer is overlapped with an inner region but is not overlapped with at least part of the winding portion in plan view of the mounting substrate.

13 Claims, 10 Drawing Sheets

HIGH FREQUENCY MODULE AND COMMUNICATION DEVICE

CROSS REFERENCE TO RELATED APPLICATION

This application claims priority from Japanese Patent Application No. 2021-149752 filed on Sep. 14, 2021. The content of this application is incorporated herein by reference in its entirety.

BACKGROUND OF THE DISCLOSURE

1. Field of the Disclosure

The present disclosure generally relates to a high frequency module and a communication device, and more specifically relates to a high frequency module and a communication device including a mounting substrate.

2. Description of the Related Art

A component built-in substrate having components built in a substrate (mounting substrate) is known (see Japanese Unexamined Patent Application Publication No. 2012-190923). In Japanese Unexamined Patent Application Publication No. 2012-190923, an opening region provided in a ground electrode is formed to be overlapped with a spiral inductor (inductor), which is included in a component built in a substrate, in plan view. On the component built-in substrate of Japanese Unexamined Patent Application Publication No. 2012-190923, other electronic components different from the spiral inductor are mounted.

BRIEF SUMMARY OF THE DISCLOSURE

In Japanese Unexamined Patent Application Publication No. 2012-190923, the opening region provided in the ground electrode makes it possible to reduce an influence of the ground electrode to the inductor and to improve a Q value of the inductor compared to a configuration in which the opening region is not provided. However, a magnetic field generated in the inductor influences other electronic components, deteriorating frequency characteristics of a high frequency module.

The present disclosure has been made in view of the above-mentioned problem and it is a possible benefit of the present disclosure to provide a high frequency module and a communication device that can reduce the deterioration of the frequency characteristics caused by an influence of a magnetic field generated in an inductor while improving a Q value of the inductor built in a mounting substrate.

A high frequency module according to an aspect of the present disclosure includes a mounting substrate, an inductor, and a plurality of electronic components. The mounting substrate has a first main surface and a second main surface that are opposed to each other. The inductor is arranged on the mounting substrate. The plurality of electronic components are arranged on the first main surface of the mounting substrate. The inductor is arranged in an inside of the mounting substrate and has a winding portion that is formed by winding a conductor portion a plurality of times in a thickness direction of the mounting substrate. The mounting substrate includes a plurality of ground layers including at least a first ground layer and a second ground layer. The first ground layer is formed in a region that is on an inner side of an outer edge of the winding portion in plan view of the mounting substrate, and the first ground layer is arranged closest to the winding portion in the thickness direction of the mounting substrate among ground layers formed in the region in the plurality of ground layers. The first ground layer is overlapped with an inner region formed on an inner side of the winding portion but is not overlapped with at least part of the winding portion in plan view of the mounting substrate.

A communication device according to an aspect of the present disclosure includes the above-described high frequency module and a signal processing circuit that processes a high frequency signal passing through the high frequency module.

The high frequency module and communication device according to the above-mentioned configuration of the present disclosure can reduce the deterioration of the frequency characteristics caused by an influence of a magnetic field generated in an inductor while improving a Q value of the inductor built in a mounting substrate.

DETAILED DESCRIPTION OF THE DISCLOSURE

Figure 1:
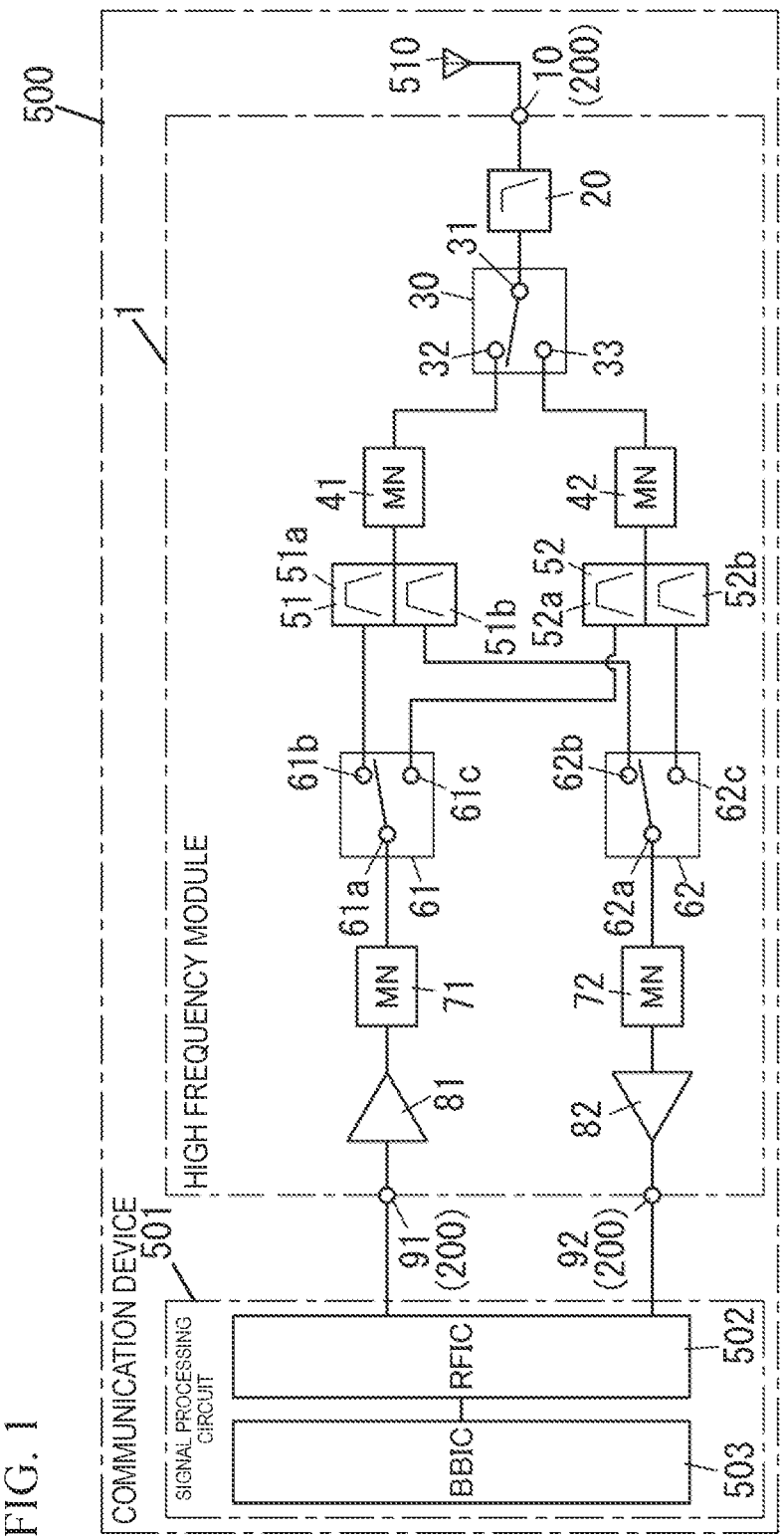
FIG. 1 is a circuit diagram for explaining a configuration of a communication device provided with a high frequency module according to an embodiment.

FIGS. 4 to 5B, FIGS. 8A and 8B, and FIGS. 12A to 15 referred to in the following embodiment and the like are schematic views and ratios of sizes and thicknesses of components in the drawings do not necessarily reflect actual dimensional ratios.

Embodiment

A high frequency module and communication device according to an embodiment will be described below with reference to FIGS. 1 to 7.

(1) Overview

A high frequency module 1 according to the present embodiment includes an antenna terminal 10, a low pass filter 20, a first switch 30, a first matching circuit 41, a second matching circuit 42, a first filter 51, and a second filter 52, as illustrated in FIG. 1. The high frequency module 1 further includes a second switch 61, a third switch 62, a third matching circuit 71, a fourth matching circuit 72, a power amplifier 81, and a low noise amplifier 82. Furthermore, the high frequency module 1 includes one or a plurality of (one in the illustrated example) signal input terminals 91 and one or a plurality of (one in the illustrated example) signal output terminals 92.

Figure 4:
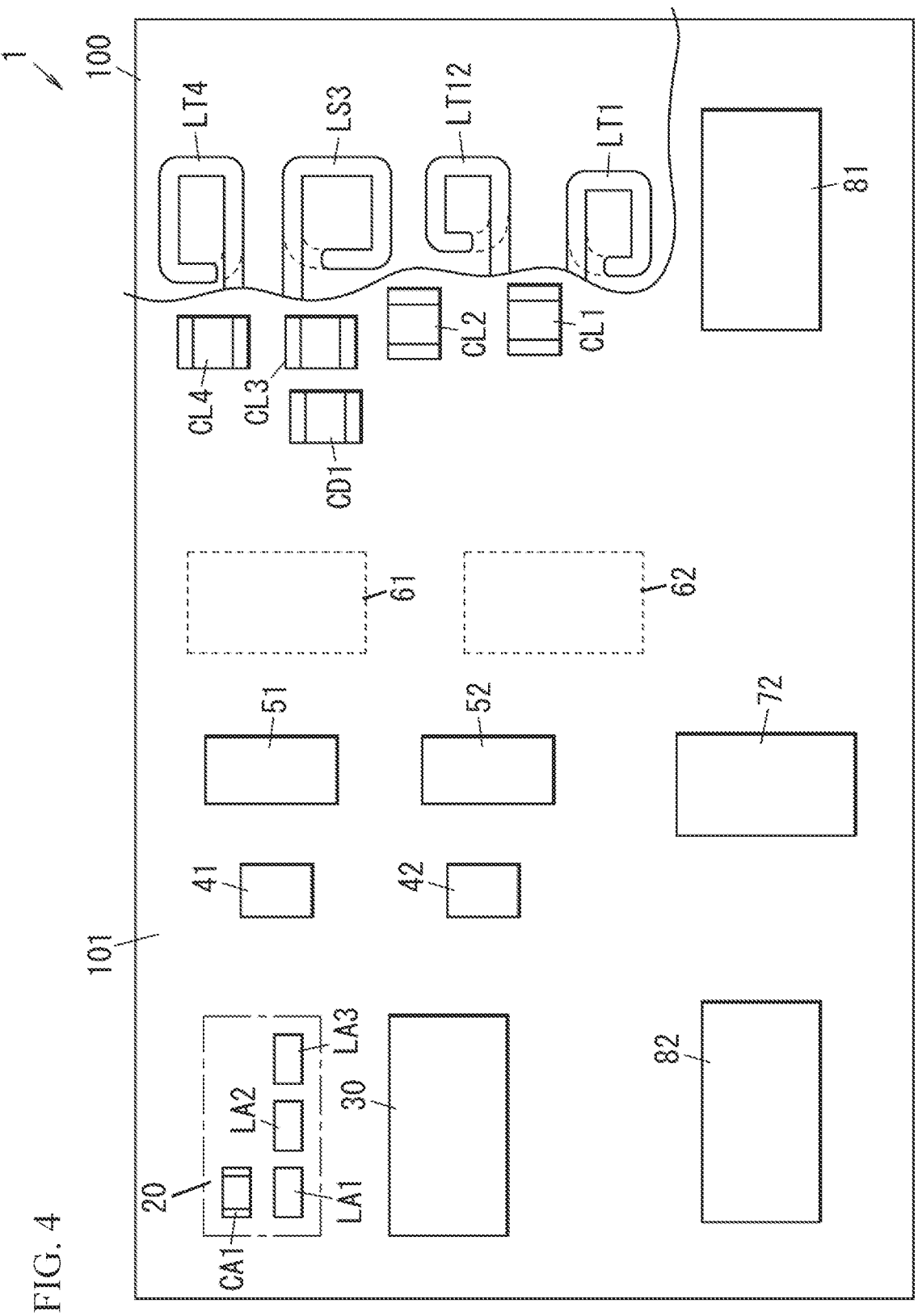
FIG. 4 is a plan view illustrating arrangement of a plurality of electronic components on a first main surface of a mounting substrate included in the high frequency module according to the embodiment.
Figure 5A:
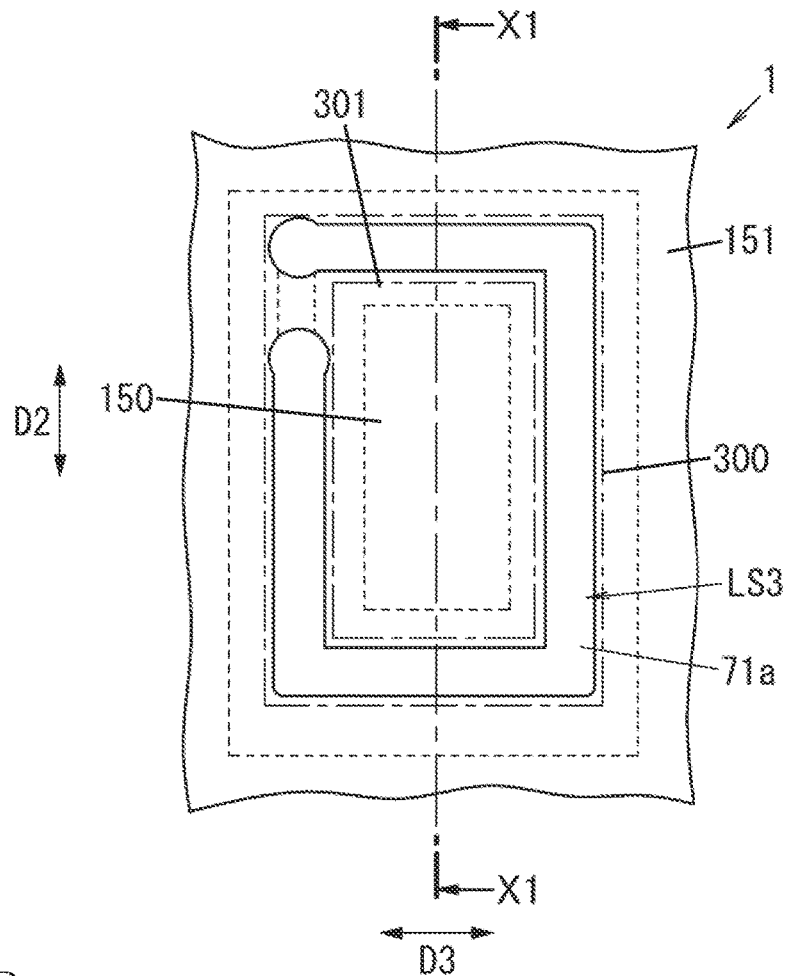
FIG. 5A is a plan view for explaining a positional relation between a winding portion of a fifth inductor included in the third matching circuit according to the embodiment and a first ground layer.
Figure 5B:
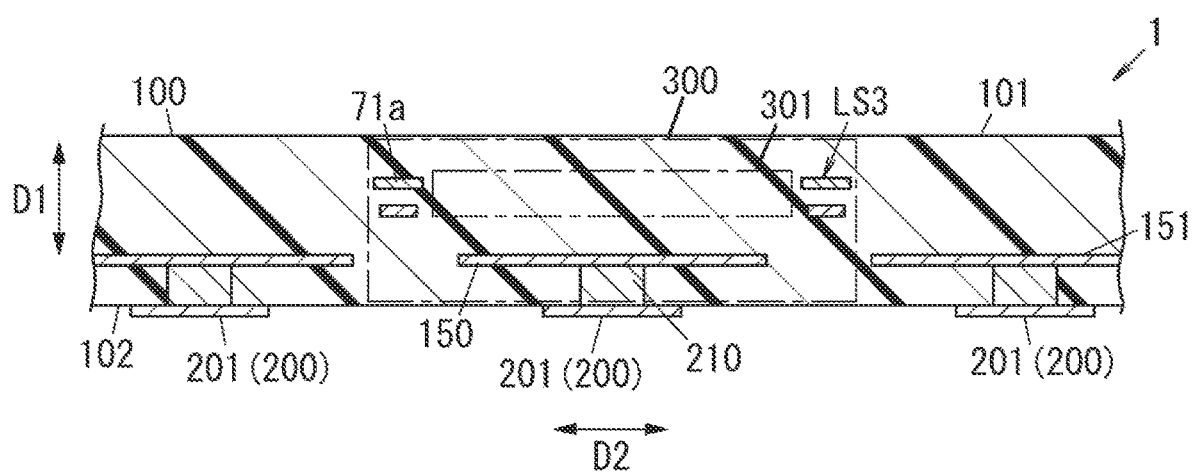
FIG. 5B is a sectional view, taken along an X1-X1 line of FIG. 5A, for explaining the positional relation between the winding portion of the fifth inductor according to the embodiment and the first ground layer.

The high frequency module 1 further includes a mounting substrate 100 and connection terminals 200, as illustrated in FIGS. 4 and 5B. The mounting substrate 100 has a first main surface 101 and a second main surface 102 that are opposed to each other in a thickness direction D1 of the mounting substrate 100. In the present embodiment, a plurality of electronic components are arranged on the first main surface 101 of the mounting substrate 100. Here, "A is arranged on the first main surface 101 of the mounting substrate 100" means not only that A is directly mounted on the first main surface 101 of the mounting substrate 100 but also that, of a space closer to the first main surface 101 and a space closer to the second main surface 102 that are separated in the mounting substrate 100, A is arranged in the space closer to the first main surface 101. That is, the configuration of the above expression includes a configuration in which A is mounted on the first main surface 101 of the mounting substrate 100 with other circuit elements, electrodes, and the like interposed therebetween. The plurality of electronic components include the low pass filter 20 and the fourth matching circuit 72. That is, the low pass filter 20 and the fourth matching circuit 72 are arranged on the first main surface 101 of the mounting substrate 100. Here, the first switch 30, the first matching circuit 41, the second matching circuit 42, the first filter 51, the second filter 52, the power amplifier 81, and the low noise amplifier 82 are also arranged on the first main surface 101 of the mounting substrate 100 as well as the low pass filter 20 and the fourth matching circuit 72, in the present embodiment (see FIG. 4). The second switch 61 and the third switch 62 are arranged on the second main surface 102 of the mounting substrate 100.

Figure 3:
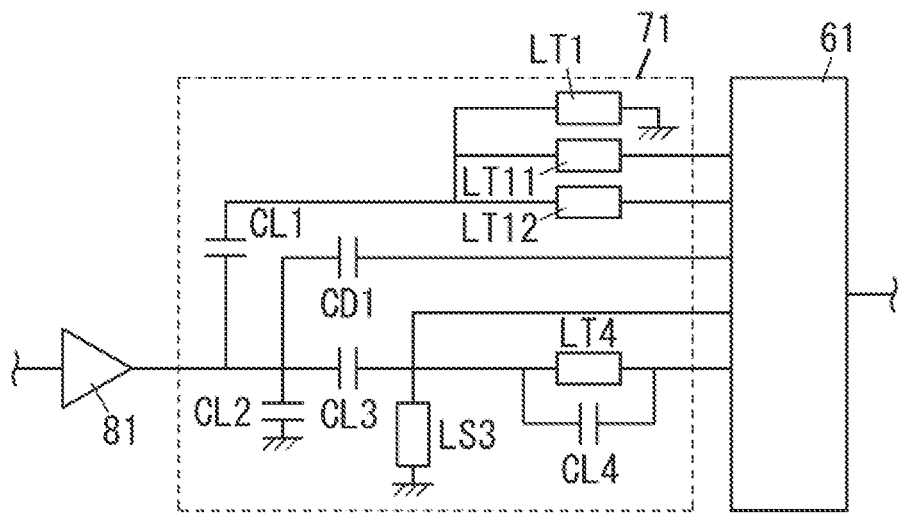
FIG. 3 is a circuit diagram for explaining a configuration of a third matching circuit included in the high frequency module according to the embodiment.

The third matching circuit 71 includes inductors (for example, an inductor LS3 illustrated in FIG. 3). The inductor LS3 is arranged on the mounting substrate 100. The inductor LS3 is formed in the inside of the mounting substrate 100, in the present embodiment. The inductor LS3 is arranged in the inside of the mounting substrate 100 and has a winding portion 71a, as illustrated in FIG. 5B. The winding portion 71a is formed by winding a conductor portion (a conductor pattern portion, a via conductor) a plurality of times (twice in the illustrated example) in the thickness direction D1 of the mounting substrate 100. Here, FIG. 5B omits illustration of the electronic components arranged on the first main surface 101 of the mounting substrate 100 and illustration of the electronic components (for example, the second switch 61 and the third switch 62) arranged on the second main surface 102 of the mounting substrate 100.

The mounting substrate 100 is a multilayer substrate and includes a plurality of ground layers including at least a first ground layer 150 (see FIGS. 5A and 5B) and a second ground layer. The first ground layer 150 is formed in a region 300 (see FIGS. 5A and 5B) that is on the inner side of an outer edge of the winding portion 71a in plan view of the mounting substrate 100. Further, the first ground layer 150 is arranged closest to the winding portion 71a in the thickness direction D1 of the mounting substrate 100 among ground layers formed in the region 300 in the plurality of ground layers. The first ground layer 150 is overlapped with an inner region 301 (see FIG. 5B) formed on the inner side of the winding portion 71a but is not overlapped with at least part of the winding portion 71a in plan view of the mounting substrate 100. Here, the expression "arranged closest to the winding portion 71a in the thickness direction D1 of the mounting substrate 100 among ground layers formed in the region 300 in the plurality of ground layers" means not only that there are no other ground layers between the first ground layer 150 and the winding portion 71a in the thickness direction D1 of the mounting substrate 100 but also that the position of the first ground layer 150 and the position of an end portion of the winding portion 71a are identical to each other in the thickness direction D1 of the mounting substrate 100. Further, "plan view in the thickness direction D1 of the mounting substrate 100" means viewing the mounting substrate 100 and components arranged on the mounting substrate 100 in an orthographic projection onto a plane parallel to the main surface (for example, the first main surface 101) of the mounting substrate 100. Further, "the position of A and the position of B are identical to each other in the thickness direction D1 of the mounting substrate 100" is sometimes referred to as "A and B are positioned in the same layer in the thickness direction D1 of the mounting substrate 100". Here, FIG. 5A omits illustration of layers of the mounting substrate 100 that are closer to the first main surface 101 of the mounting substrate 100 with respect to the winding portion 71a. The winding portion 71a is formed by winding the conductor portion (the conductor pattern portion, the via conductor) a plurality of times (twice in the illustrated example) in the thickness direction D1. That is, the winding portion 71a is formed in a manner such that a plurality of conductor pattern portions are connected by one or more via conductors in the thickness direction D1 of the mounting substrate 100. The conductor pattern portions are provided to a plurality of dielectric layers that are mutually laminated and will be described later. Here, "the winding portion formed by winding a conductor portion a plurality of times" means a spiral (helically-structured) winding portion that is formed in a manner such that a plurality of conductor pattern portions, which are provided to a plurality of dielectric layers mutually laminated, are connected by one or more via conductors. For example, a "winding portion formed by winding a conductor portion n times" means a spiral winding portion that is formed in a manner such that a plurality of conductor pattern portions, which are provided to n pieces of dielectric layers mutually laminated, are connected by one or more via conductors. In other words, "winding a conductor portion a plurality of times" means a winding portion formed in a state in which an elongated conductor portion, which is composed of a plurality of conductor pattern portions mutually connected by a via conductor, is wound about a winding axis a plurality of times. The "region 300 that is on the inner side of the outer edge of the winding portion 71a" indicates a region whose outer circumference is the outermost outer edge among outer edges of respective conductor pattern portions constituting the winding portion 71a. The "inner region 301 formed on the inner side of the winding portion 71a" indicates a region whose outer circumference is the innermost inner edge among inner edges of respective conductor pattern portions constituting the winding portion 71a.

The high frequency module 1 according to the embodiment is used for a communication device 500 that is multimode/multiband compatible, for example, as illustrated in FIG. 1. The communication device 500 is, for example, a mobile phone (such as a smart phone). However, it is not limited to a mobile phone, and the communication device 500 may be, for example, a wearable terminal (such as a smart watch). The high frequency module 1 is, for example, a module that can support fourth generation mobile communication (4G) standards, fifth generation mobile communication (5G) standards, and the like. The 4G standards are 3GPP long term evolution (LTE) standards, for example. The 5G standards are 5G new radio (NR), for example.

The antenna terminal 10 is electrically connected with an antenna 510 (see FIG. 1). Here, the definition "A is connected with B" includes not only a configuration in which A and B are in contact with each other but also a configuration in which A and B are electrically connected with each other via a conductor electrode, a conductor terminal, wiring, other circuit components, or the like.

The first switch 30 is configured to be able to connect the first filter 51 and the second filter 52 to the antenna 510. That is, the high frequency module 1 is a module that can support carrier aggregation and dual connectivity. Here, carrier aggregation and dual connectivity refer to communication that uses radio waves in a plurality of frequency bands at the same time. Signal transmission by carrier aggregation or dual connectivity is sometimes referred to as simultaneous transmission hereinafter. The expression that simultaneous transmission is possible means that signal transmission by carrier aggregation or dual connectivity is possible.

(2) Configuration

Configurations of the high frequency module 1 and the communication device 500 according to the embodiment will be described below with reference to FIGS. 1 to 10.

The high frequency module 1 is configured to amplify a transmission signal (high frequency signal) inputted from a signal processing circuit 501 (see FIG. 1) and output the amplified signal to the antenna 510, for example. The high frequency module 1 is configured to amplify a reception signal (high frequency signal) inputted from the antenna 510 and output the amplified signal to the signal processing circuit 501, for example. The signal processing circuit 501 is not a component of the high frequency module 1 but is a component of the communication device 500 provided with the high frequency module 1. The high frequency module 1 is controlled by the signal processing circuit 501 provided to the communication device 500, for example. The communication device 500 is provided with the high frequency module 1 and the signal processing circuit 501. The communication device 500 is further provided with the antenna 510. The communication device 500 further includes a circuit substrate on which the high frequency module 1 is mounted. The circuit substrate is, for example, a printed wiring board. The circuit substrate includes a ground electrode to which ground potential is applied.

The antenna 510 is connected with the antenna terminal 10 of the high frequency module 1. The antenna 510 has a transmission function for radiating a transmission signal, outputted from the high frequency module 1, by a radio wave and a reception function for receiving a reception signal as a radio wave from the outside and outputting the reception signal to the high frequency module 1.

The signal processing circuit 501 processes a high frequency signal (for example, a reception signal or a transmission signal) that passes through the high frequency module 1. The signal processing circuit 501 includes, for example, an RF signal processing circuit 502 and a baseband signal processing circuit 503. The RF signal processing circuit 502 is a radio frequency integrated circuit (RFIC), for example, and performs signal processing with respect to a high frequency signal. The RF signal processing circuit 502 performs signal processing such as up-conversion with respect to a high frequency signal (a transmission signal) outputted from the baseband signal processing circuit 503 and outputs the high frequency signal subjected to the signal processing, for example. Also, the RF signal processing circuit 502 performs signal processing such as down-conversion with respect to a high frequency signal (a reception signal) outputted from the high frequency module 1 and outputs the high frequency signal subjected to the signal processing to the baseband signal processing circuit 503, for example.

The baseband signal processing circuit 503 is a baseband integrated circuit (BBIC), for example. The baseband signal processing circuit 503 generates an I-phase signal and a Q-phase signal from a baseband signal. A baseband signal is a sound signal, an image signal, and the like inputted from the outside, for example. The baseband signal processing circuit 503 performs IQ modulation processing by combining an I-phase signal and a Q-phase signal and outputs a transmission signal. Here, the transmission signal is generated as a modulation signal (an IQ signal) obtained by amplitude-modulating a carrier signal of a predetermined frequency into a signal having a longer period than the period of the carrier signal. A reception signal processed in the baseband signal processing circuit 503 is used, for example, for image display as an image signal or for calling as a sound signal. The high frequency module 1 according to the first embodiment transmits a high frequency signal (a transmission signal or a reception signal) between the antenna 510 and the RF signal processing circuit 502 of the signal processing circuit 501.

The high frequency module 1 includes the antenna terminal 10, the low pass filter 20, the first switch 30, the first matching circuit 41, the second matching circuit 42, the first filter 51, and the second filter 52, as illustrated in FIG. 1. The high frequency module 1 further includes the second switch 61, the third switch 62, the third matching circuit 71, the fourth matching circuit 72, the power amplifier 81, and the low noise amplifier 82. Furthermore, the high frequency module 1 includes one or a plurality of (one in the illustrated example) signal input terminals 91 and one or a plurality of (one in the illustrated example) signal output terminals 92.

The antenna terminal 10 is electrically connected with the antenna 510.

The low pass filter 20 is arranged between the antenna terminal 10 and the first switch 30. In other words, the low pass filter 20 is connected between the antenna terminal 10 and the first switch 30. "C is connected between A and B" means that C is connected with both of A and B on a position between A and B. That is, one end of the low pass filter 20 is connected with the antenna terminal 10, and the other end of the low pass filter 20 is connected with the first switch 30.

Figure 2:
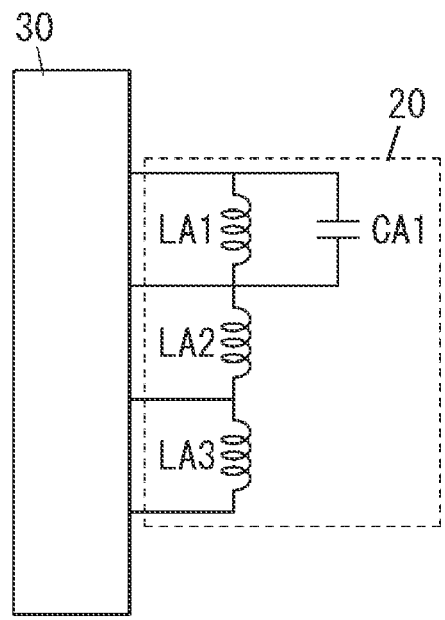
FIG. 2 is a circuit diagram for explaining a configuration of a low pass filter included in the high frequency module according to the embodiment.

The low pass filter 20 is a filter that passes a signal of a predetermined or lower frequency band. The low pass filter 20 includes a plurality (three pieces in the illustrated example) of inductors LA1, LA2, and LA3 and a capacitor CA1 as elements constituting the low pass filter 20, as illustrated in FIG. 2. Each of the inductors LA1, LA2, and LA3 is a chip inductor and is arranged on the first main surface 101 of the mounting substrate 100. The inductors LA1, LA2, and LA3 are connected in series. One end of the inductor LA1 is connected with the first switch 30, and the other end of the inductor LA1 is connected with one end of the inductor LA2. The other end of the inductor LA2 is connected with one end of the inductor LA3. The other end of the inductor LA3 is connected with the first switch 30. A point (node) between the inductor LA1 and the inductor LA2 is connected with the first switch 30. A point (node) between the inductor LA2 and the inductor LA3 is connected with the first switch 30. The capacitor CA1 is arranged on the first main surface 101 of the mounting substrate 100. The capacitor CA1 is connected with the inductor LA1 in parallel. Here, the low pass filter 20 may be an integrated passive device (IPD) including a plurality of inductors and capacitors.

The first switch 30 is a switch integrated circuit (IC) composed of one chip. The first switch 30 is configured to be able to connect the first filter 51 (see FIG. 1) and the second filter 52 (see FIG. 1) to the antenna 510 (see FIG. 1). The first switch 30 is configured to be able to simultaneously connect the first filter 51 and the second filter 52 to the antenna 510. That is, the first switch 30 is a switch IC including a switch that enables the first filter 51 and the second filter 52 to be connected to the antenna 510.

The first switch 30 is electrically connected with the antenna terminal 10. Specifically, the first switch 30 is electrically connected with the antenna terminal 10 via the low pass filter 20. The first switch 30 is electrically connected with the first filter 51 and the second filter 52. Specifically, the first switch 30 includes a first terminal 31, a second terminal 32, and a third terminal 33. The first switch 30 selects at least one terminal of the second terminal 32 and the third terminal 33 as a connection destination of the first terminal 31 under the control of the signal processing circuit 501.

The first terminal 31 is electrically connected with the antenna terminal 10. That is, the first terminal 31 is electrically connected with the antenna 510 via the low pass filter 20 and the antenna terminal 10. Here, the first terminal 31 may be connected with the antenna terminal 10 via a coupler and the like as well as the low pass filter 20 or may be directly connected with the antenna terminal 10.

The second terminal 32 is electrically connected with the first filter 51. The third terminal 33 is electrically connected with the second filter 52.

The first matching circuit 41 is, for example, an inductor. More specifically, the first matching circuit 41 is a chip inductor. The first matching circuit 41 is electrically connected in a path between the first switch 30 and the first filter 51 and provides impedance matching between the first switch 30 and the first filter 51.

The second matching circuit 42 is, for example, an inductor. More specifically, the second matching circuit 42 is a chip inductor. The second matching circuit 42 is electrically connected in a path between the first switch 30 and the second filter 52 and provides impedance matching between the first switch 30 and the second filter 52.

The first filter 51 is a duplexer and includes a first transmission filter 51a and a first reception filter 51b.

The first transmission filter 51a is a transmission filter that passes a transmission signal (a first transmission signal) in a predetermined frequency band (first frequency band) outputted from the power amplifier 81. The first transmission filter 51a passes the first transmission signal in the Band 8 transmission band (880 MHz to 915 MHz) of the 4G standards, for example. The first transmission filter 51a is electrically connected with the first switch 30 via the first matching circuit 41. That is, the first transmission filter 51a is connected with the first switch 30 and passes the first transmission signal. The first transmission filter 51a is, for example, a ladder filter and includes a plurality (four pieces, for example) of serial arm resonators and a plurality (three pieces, for example) of parallel arm resonators. The first transmission filter 51a is, for example, an acoustic wave filter. Each of the plurality of serial arm resonators and the plurality of parallel arm resonators in the acoustic wave filter is composed of an acoustic wave resonator. The acoustic wave filter is a surface acoustic wave filter using a surface acoustic wave, for example. Each of the plurality of serial arm resonators and the plurality of parallel arm resonators in the surface acoustic wave filter is a surface acoustic wave (SAW) resonator, for example. Here, the first transmission filter 51a is not limited to a SAW filter. The first transmission filter 51a may be, for example, a bulk acoustic wave (BAW) filter other than a SAW filter. Alternatively, the first transmission filter 51a may be composed of a film bulk acoustic resonator (FBAR) or the like. Also, the first transmission filter 51a may be composed of an LC resonance circuit or the like.

The first reception filter 51b is a reception filter that passes a reception signal (a first reception signal) in a second frequency band inputted into the low noise amplifier 82, for example. The first reception filter 51b passes the first reception signal in the Band 8 transmission band (925 MHz to 960

MHz) of the 4G standards, for example. The first reception filter 51*b* is electrically connected with the first switch 30 via the first matching circuit 41. That is, the first reception filter 51*b* is connected with the first switch 30 and passes the first reception signal. The first reception filter 51*b* is, for example, a ladder filter and includes a plurality (four pieces, for example) of serial arm resonators and a plurality (three pieces, for example) of parallel arm resonators. The first reception filter 51*b* is an acoustic wave filter, for example. Each of the plurality of serial arm resonators and the plurality of parallel arm resonators in the acoustic wave filter is composed of an acoustic wave resonator. The acoustic wave filter is a surface acoustic wave filter using a surface acoustic wave, for example. Each of the plurality of serial arm resonators and the plurality of parallel arm resonators in the surface acoustic wave filter is a SAW resonator, for example. Here, the first reception filter 51*b* is not limited to a SAW filter. The first reception filter 51*b* may be, for example, a BAW filter other than a SAW filter. Alternatively, the first reception filter 51*b* may be composed of an FBAR or the like. Also, the first reception filter 51*b* may be composed of an LC resonance circuit or the like.

The second filter 52 is a duplexer and includes a second transmission filter 52*a* and a second reception filter 52*b*.

The second transmission filter 52*a* is a transmission filter that passes a transmission signal (a second transmission signal) in a third frequency band outputted from the power amplifier 81. The second transmission filter 52*a* passes the second transmission signal in the Band 12 transmission band (699 MHz to 716 MHz) of the 4G standards, for example. The second transmission filter 52*a* is electrically connected with the first switch 30 via the second matching circuit 42. That is, the second transmission filter 52*a* is connected with the first switch 30 and passes the second transmission signal. The second transmission filter 52*a* is, for example, a ladder filter and includes a plurality (four pieces, for example) of serial arm resonators and a plurality (three pieces, for example) of parallel arm resonators. The second transmission filter 52*a* is, for example, an acoustic wave filter. Each of the plurality of serial arm resonators and the plurality of parallel arm resonators in the acoustic wave filter is composed of an acoustic wave resonator. The acoustic wave filter is a surface acoustic wave filter using a surface acoustic wave, for example. Each of the plurality of serial arm resonators and the plurality of parallel arm resonators in the surface acoustic wave filter is a SAW resonator, for example. Here, the second transmission filter 52*a* is not limited to a SAW filter. The second transmission filter 52*a* may be, for example, a BAW filter other than a SAW filter. Alternatively, the second transmission filter 52*a* may be composed of a FBAR or the like. Also, the second transmission filter 52*a* may be composed of an LC resonance circuit or the like.

The second reception filter 52*b* is a reception filter that passes a reception signal (a second reception signal) in the second frequency band inputted into the low noise amplifier 82, for example. The second reception filter 52*b* passes the second reception signal in the Band 12 reception band (729 MHz to 746 MHz) of the 4G standards, for example. The second reception filter 52*b* is electrically connected with the first switch 30 via the second matching circuit 42. That is, the second reception filter 52*b* is connected with the first switch 30 and passes the second reception signal. The second reception filter 52*b* is, for example, a ladder filter and includes a plurality (four pieces, for example) of serial arm resonators and a plurality (three pieces, for example) of parallel arm resonators. The second reception filter 52*b* is an acoustic wave filter, for example. Each of the plurality of serial arm resonators and the plurality of parallel arm resonators in the acoustic wave filter is composed of an acoustic wave resonator. The acoustic wave filter is a surface acoustic wave filter using a surface acoustic wave, for example. Each of the plurality of serial arm resonators and the plurality of parallel arm resonators in the surface acoustic wave filter is a SAW resonator, for example. Here, the second reception filter 52*b* is not limited to a SAW filter. The second reception filter 52*b* may be, for example, a BAW filter other than a SAW filter. Alternatively, the second reception filter 52*b* may be composed of an FBAR or the like. Also, the second reception filter 52*b* may be composed of an LC resonance circuit or the like.

The first filter 51 is electrically connected with the antenna terminal 10 via the first matching circuit 41, the first switch 30, and the low pass filter 20, and the second filter 52 is electrically connected with the antenna terminal 10 via the second matching circuit 42, the first switch 30, and the low pass filter 20. That is, the low pass filter 20 is arranged between a filter (the first filter 51 or the second filter 52), which passes a transmission signal (the first transmission signal or the second transmission signal), and the antenna terminal 10.

The second switch 61 is composed of one chip and switches a filter to be connected to the power amplifier 81. Specifically, the second switch 61 includes a common terminal 61*a* and a plurality (two piece in the illustrated example) of selection terminals 61*b* and 61*c*. The second switch 61 selects at least one terminal of the plurality of selection terminals 61*b* and 61*c* as a connection destination of the common terminal 61*a* under the control of the signal processing circuit 501. The common terminal 61*a* is electrically connected with the power amplifier 81. The plurality of selection terminals 61*b* and 61*c* are connected with the first switch 30. That is, the plurality of selection terminals 61*b* and 61*c* are electrically connected with the antenna terminal 10 via the first switch 30. In other words, the plurality of selection terminals 61*b* and 61*c* are electrically connected with the antenna 510 via the antenna terminal 10. Specifically, the selection terminal 61*b* is electrically connected with the first transmission filter 51*a* of the first filter 51, and the selection terminal 61*b* is electrically connected with the antenna 510 via the first transmission filter 51*a*. The selection terminal 61*c* is electrically connected with the second transmission filter 52*a* of the second filter 52, and the selection terminal 61*c* is electrically connected with the antenna 510 via the second transmission filter 52*a*.

The third switch 62 is composed of one chip and switches a filter to be connected to the low noise amplifier 82. Specifically, the third switch 62 includes a common terminal 62*a* and a plurality (two piece in the illustrated example) of selection terminals 62*b* and 62*c*. The third switch 62 selects at least one terminal of the plurality of selection terminals 62*b* and 62*c* as a connection destination of the common terminal 62*a* at the time of receiving a signal under the control of the signal processing circuit 501. The common terminal 62*a* is electrically connected with the low noise amplifier 82. The plurality of selection terminals 62*b* and 62*c* are connected with the first switch 30. That is, the plurality of selection terminals 62*b* and 62*c* are electrically connected with the antenna terminal 10 via the first switch 30. In other words, the plurality of selection terminals 62*b* and 62*c* are electrically connected with the antenna 510 via the antenna terminal 10. Specifically, the selection terminal 62*b* is electrically connected with the first reception filter 51*b* of the first filter 51, and the selection terminal 62*b* is electrically connected with the antenna 510 via the first reception filter 51b. The selection terminal 62c is electrically connected with the second reception filter 52b of the second filter 52, and the selection terminal 62c is electrically connected with the antenna 510 via the second reception filter 52b.

The third matching circuit 71 is electrically connected in a path between the second switch 61 and the power amplifier 81 and provides impedance matching between the second switch 61 and the power amplifier 81. One end of the third matching circuit 71 is connected with an output terminal of the power amplifier 81. The other end of the third matching circuit 71 is connected with the common terminal 61a of the second switch 61.

The third matching circuit 71 includes a plurality (five pieces in the illustrated example) of capacitors CL1, CL2, CL3, CL4, and CD1 and a plurality (five pieces in the illustrated example) of inductors LT1, LT11, LT12, LT4, and LS3, as illustrated in FIG. 3. The inductor LT1, the inductor LT11, the inductor LT12, the inductor LT4, and the inductor LS3 are sometimes referred to as a first inductor LT1, a second inductor LT11, a third inductor LT12, a fourth inductor LT4, and a fifth inductor LS3 respectively, hereinafter.

Each of the plurality of capacitors CL1, CL2, CL3, CL4, and CD1 is arranged on the first main surface 101 of the mounting substrate 100, as illustrated in FIG. 4. The first inductor LT1, the second inductor LT11, the third inductor LT12, the fourth inductor LT4, and the fifth inductor LS3 are arranged on the mounting substrate 100. The first inductor LT1, the second inductor LT11, the third inductor LT12, the fourth inductor LT4, and the fifth inductor LS3 are formed in the inside of the mounting substrate 100, in the present embodiment (see FIG. 4). Here, the second inductor LT11 is arranged on a lower layer than the first inductor LT1 (arranged closer to the second main surface 102 of the mounting substrate 100 than the inductor LT1). FIG. 4 omits the illustration of the inductor LT11 because the inductor LT11 is overlapped with the first inductor LT1 in plan view of the mounting substrate 100.

The fifth inductor LS3 is arranged in the inside of the mounting substrate 100 and has the winding portion 71a that is formed by winding a conductor portion (a conductor pattern portion, a via) a plurality of times in the thickness direction D1 of the mounting substrate 100, as illustrated in FIGS. 5A and 5B. The winding portion 71a is formed in a manner such that conductor pattern portions are connected by a via in the thickness direction D1 of the mounting substrate 100. The conductor pattern portions are provided to a plurality of dielectric layers that are mutually laminated and will be described later. In other words, the fifth inductor LS3 is an inductor having a helical structure. The first inductor LT1, the second inductor LT11, the third inductor LT12, and the fourth inductor LT4 are also arranged in the inside of the mounting substrate 100 and are helically-structured inductors having a winding portion, which is formed by winding a conductor portion (a conductor pattern portion, a via) a plurality of times in the thickness direction D1 of the mounting substrate 100, in a similar manner. The winding portion included in each of the first inductor LT1, the second inductor LT11, the third inductor LT12, and the fourth inductor LT4 is formed by connecting conductor pattern portions provided to a plurality of dielectric layers by a via, in a similar manner to the winding portion 71a.

Each of one ends of the capacitors CL1, CL2, CL3, and CD1 is connected with the output terminal of the power amplifier 81, as illustrated in FIG. 3. Specifically, each of one ends of the capacitors CL1, CL2, and CD1 is connected with a path between the capacitor CL3 and the output terminal of the power amplifier 81. The other end of the capacitor CL1 is connected with one end of each of the first inductor LT1, the second inductor LT11, and the third inductor LT12. The other end of the capacitor CL2 is connected to a ground. The other end of the capacitor CL3 is connected with one end of the fourth inductor LT4. The other end of the capacitor CD1 is connected with the second switch 61. The capacitor CL4 is connected with the fourth inductor LT4 in parallel.

One end of the first inductor LT1 is connected with the capacitor CL1 as mentioned above, and the other end of the first inductor LT1 is connected to the ground. One end of the second inductor LT11 is connected with the capacitor CL1 as mentioned above, and the other end of the second inductor LT11 is connected with the second switch 61. One end of the third inductor LT12 is connected with the capacitor CL1 as mentioned above, and the other end of the third inductor LT12 is connected with the second switch 61. Each of the second inductor LT11 and the third inductor LT12 is switched to be connected or unconnected to the ground based on the function of the second switch 61.

One end of the fourth inductor LT4 is connected with the capacitor CL3 as mentioned above. The other end of the fourth inductor LT4 is connected with the second switch 61. The other end of the fourth inductor LT4 is connected to the ground via a variable capacitance capacitor provided to the second switch 61. One end of the fifth inductor LS3 is connected with a path between the capacitor CL3 and the fourth inductor LT4. The other end of the fifth inductor LS3 is connected to the ground.

The fourth matching circuit 72 is, for example, an inductor. More specifically, the fourth matching circuit 72 is a chip inductor. The fourth matching circuit 72 is electrically connected in a path between the third switch 62 and the low noise amplifier 82 and provides impedance matching between the third switch 62 and the low noise amplifier 82.

The power amplifier 81 is an amplifier that amplifies a transmission signal (the first transmission signal or the second transmission signal) outputted from the RF signal processing circuit 502 of the signal processing circuit 501. An input terminal of the power amplifier 81 is electrically connected with the signal input terminal 91. The output terminal of the power amplifier 81 is electrically connected with the third matching circuit 71. That is, the power amplifier 81 is electrically connected with the first transmission filter 51a of the first filter 51 via the third matching circuit 71 and is electrically connected with the second transmission filter 52a of the second filter 52 via the third matching circuit 71. In other words, the power amplifier 81 is electrically connected with the first switch 30 via the first filter 51 and the second filter 52.

The low noise amplifier 82 is an amplifier that amplifies a reception signal (the first reception signal or the second reception signal) passing through the first reception filter 51b of the first filter 51 or the second reception filter 52b of the second filter 52, with low noise. An input terminal of the low noise amplifier 82 is electrically connected with the fourth matching circuit 72, and an output terminal of the low noise amplifier 82 is electrically connected with the signal output terminal 92. That is, the low noise amplifier 82 is electrically connected with the first reception filter of the first filter 51 via the fourth matching circuit 72 and is electrically connected with the second reception filter 52b of the second filter 52 via the fourth matching circuit 72. In other words, the low noise amplifier 82 is electrically connected with the first switch 30 via the first filter 51 and the second filter 52.

The high frequency module 1 further includes the mounting substrate 100 as illustrated in FIGS. 4 and 5B. The mounting substrate 100 has the first main surface 101 and the second main surface 102 that are opposed to each other in the thickness direction D1 of the mounting substrate 100.

The mounting substrate 100 is, for example, a printed wiring board, a low temperature co-fired ceramics (LTCC) substrate, a high temperature co-fired ceramics (HTCC) substrate, or a resin multilayer substrate. Here, the mounting substrate 100 is, for example, a multi-layer substrate including a plurality of dielectric layers and a plurality of conductive layers and is a ceramic substrate. The plurality of dielectric layers and the plurality of conductive layers are laminated in the thickness direction D1 of the mounting substrate 100. The plurality of conductive layers are formed in predetermined patterns defined for respective layers. Each of the plurality of conductive layers has one or a plurality of conductor portions in one plane orthogonal to the thickness direction D1 of the mounting substrate 100. The material of each conductive layer is copper, for example. The plurality of conductive layers include a ground layer. In the high frequency module 1, one or more ground terminals 201, which are included in the plurality of connection terminals 200 (see FIG. 5B), and the ground layer are electrically connected with each other through a via conductor 210, a pad, or the like included in the mounting substrate 100.

The mounting substrate 100 is not limited to a printed wiring board or an LTCC substrate, and may be a wiring structure. The wiring structure is, for example, a multilayer structure. The multilayer structure includes at least one insulating layer and at least one conductive layer. The insulating layer is formed in a predetermined pattern. When there are a plurality of insulating layers, the plurality of insulating layers are formed in predetermined patterns defined for respective layers. The conductive layer is formed in a predetermined pattern which is different from the predetermined pattern of the insulating layer. When there are a plurality of conductive layers, the plurality of conductive layers are formed in predetermined patterns defined for respective layers. The conductive layer may include one or a plurality of rewiring portions. In the wiring structure, a first surface of two surfaces opposed to each other in a thickness direction of the multilayer structure is the first main surface 101 of the mounting substrate 100, and a second surface is the second main surface 102 of the mounting substrate 100. The wiring structure may be, for example, an interposer. The interposer may be an interposer composed of a silicon substrate or may be a substrate composed of multiple layers.

The first main surface 101 and the second main surface 102 of the mounting substrate 100 are separated from each other in the thickness direction D1 of the mounting substrate 100 and intersect with the thickness direction D1 of the mounting substrate 100. The first main surface 101 in the mounting substrate 100 is, for example, orthogonal to the thickness direction D1 of the mounting substrate 100, but the first main surface 101 may include a lateral surface of the conductor portion or the like as a surface that is not orthogonal to the thickness direction D1, for example. Also, the second main surface 102 in the mounting substrate 100 is, for example, orthogonal to the thickness direction D1 of the mounting substrate 100, but the second main surface 102 may include a lateral surface of the conductor portion or the like as a surface that is not orthogonal to the thickness direction D1, for example. Further, on the first main surface 101 and the second main surface 102 of the mounting substrate 100, fine irregularities, concavities, or convexities may be formed. The mounting substrate 100 has a rectangular shape in plan view in the thickness direction D1 of the mounting substrate 100. However, it is not limited to the rectangular shape, and the mounting substrate 100 may have, for example, a square shape.

The high frequency module 1 includes a plurality of electronic components that are arranged on the first main surface 101 of the mounting substrate 100. The plurality of electronic components arranged on the first main surface 101 of the mounting substrate 100 include the low pass filter 20 and the fourth matching circuit 72. In plan view in the thickness direction D1 of the mounting substrate 100, an outer circumferential shape of each of the plurality of electronic components is a quadrangular shape (rectangular shape).

The plurality of connection terminals 200 are formed in a prismatic shape and are arranged on the second main surface 102. More specifically, a material of the plurality of connection terminals 200 is, for example, metal (such as copper and a copper alloy).

The plurality of connection terminals 200 include the antenna terminal 10, one or more ground terminals 201, the signal input terminal 91, and the signal output terminal 92. One or more ground terminals 201 are connected with the ground layer of the mounting substrate 100 as mentioned above. The ground layer is a circuit ground of the high frequency module 1. The plurality of connection terminals 200 correspond to a plurality of external connection terminals (not illustrated), which are composed of pillar electrodes, one to one and are connected to the circuit substrate (not illustrated), provided to the communication device 500, via the plurality of external connection terminals. One or more ground terminals 201 included in the plurality of connection terminals 200 are terminals which are electrically connected with the ground electrode of the circuit substrate provided to the communication device 500 and to which ground potential is applied.

The mounting substrate 100 includes a first resin layer (not illustrated) that is arranged on the first main surface 101 side of the mounting substrate 100 and covers at least part of the outer circumferential surfaces of the electronic components such as the low pass filter 20 arranged on the first main surface 101 of the mounting substrate 100. Further, the mounting substrate 100 includes a second resin layer (not illustrated) that is arranged on the second main surface 102 of the mounting substrate 100 and covers part of each of the electronic components such as the second switch 61 and the plurality of connection terminals 200 arranged on the second main surface 102 of the mounting substrate 100. The first resin layer and the second resin layer contain resin (for example, epoxy resin). The first resin layer and the second resin layer may contain filler as well as resin. The material of the second resin layer 125 may be the same material as the material of the first resin layer 120 or may be a different material.

The plurality of external connection terminals are not limited to pillar electrodes. The plurality of external connection terminals may be ball bumps. In this configuration, the mounting substrate 100 does not include the second resin layer. Also, in this configuration, the mounting substrate 100 may include an underfill portion that is provided in a gap between the electronic component (for example, the second switch 61 or the third switch 62) arranged on the second main surface of the mounting substrate 100 and the second main surface 102 of the mounting substrate 100. The material of the ball bump constituting each of the plurality of external connection terminals is gold, copper, solder, or the like, for example. The plurality of external connection terminals may include external connection terminals composed of ball bumps and external connection terminals composed of pillar electrodes in a mixed manner.

The mounting substrate 100 is a multi-layer substrate as mentioned above, and the first inductor LT1, the second inductor LT11, the third inductor LT12, the fourth inductor LT4, and the fifth inductor LS3 that are included in the third matching circuit 71 are formed in the inside of the mounting substrate 100 as mentioned above (see FIG. 4). The winding portion 71a, which is wound a plurality of times in the thickness direction D1 of the mounting substrate 100, of the fifth inductor LS3 is formed in a manner such that conductor patterns, respectively provided to a plurality of dielectric layers that are mutually laminated, are mutually connected by a via in the thickness direction D1 of the mounting substrate 100. The winding portion, obtained by winding the conductor portion a plurality of times in the thickness direction D1 of the mounting substrate 100, of each of the first inductor LT1, the second inductor LT11, the third inductor LT12, and the fourth inductor LT4 is formed in a manner such that conductor patterns, respectively provided to a plurality of dielectric layers that are mutually laminated, are mutually connected by a via in the thickness direction D1 of the mounting substrate 100. FIG. 4 omits illustration of one or more dielectric layers and one or more conductive layers that are between each of the first inductor LT1, the second inductor LT11, the third inductor LT12, the fourth inductor LT4, and the fifth inductor LS3, and the first main surface 101 of the mounting substrate 100.

The mounting substrate 100 is a multi-layer substrate as mentioned above and includes a plurality of ground layers. The plurality of ground layers include at least the first ground layer 150 (see FIGS. 5A and 5B) and a second ground layer (for example, a second ground layer 151). That is, the mounting substrate 100 includes at least the first ground layer 150 and the second ground layer 151.

The first ground layer 150 is formed in the region 300 that is on the inner side of the outer edge of the winding portion 71a in plan view of the mounting substrate 100. Further, the first ground layer 150 is arranged closest to the winding portion 71a in the thickness direction D1 of the mounting substrate 100 among ground layers formed in the region 300 in the plurality of ground layers (see FIGS. 5A and 5B). In the present embodiment, the first ground layer 150 is overlapped with the inner region 301 formed on the inner side of the winding portion 71a in plan view of the mounting substrate 100 but is not overlapped with the whole of the winding portion 71a. Further, in the present embodiment, the first ground layer 150 and the second ground layer 151 are arranged in the inside of the mounting substrate 100 on the side closer to the second main surface 102 of the mounting substrate 100 with respect to (the winding portion 71a of) the fifth inductor LS3.

The first ground layer 150 is connected with the ground terminal 201 through the via conductor 210. In other words, a plurality of ground terminals 201 include the ground terminal 201 which is overlapped with the first ground layer 150 in plan view of the mounting substrate 100 and which is connected with the first ground layer 150. That is, the mounting substrate 100 includes the ground terminal 201 which is overlapped with the first ground layer 150 in plan view of the mounting substrate 100 and which is connected with the first ground layer 150.

As described above, the high frequency module 1 according to the embodiment includes the mounting substrate 100, an inductor (for example, the fifth inductor LS3), and a plurality of electronic components (for example, the low pass filter 20 and the low noise amplifier 82). The mounting substrate 100 has the first main surface 101 and the second main surface 102 that are opposed to each other. The inductor is arranged on the mounting substrate 100. The plurality of electronic components are arranged on the first main surface of the mounting substrate 100. The inductor is arranged in the inside of the mounting substrate 100 and has a winding portion (for example, the winding portion 71a) that is formed by winding a conductor portion a plurality of times in the thickness direction D1 of the mounting substrate 100. The mounting substrate 100 includes a plurality of ground layers including at least the first ground layer 150 and the second ground layer. The first ground layer 150 is formed in a region (for example, the region 300) that is on the inner side of the outer edge of the winding portion in plan view of the mounting substrate 100. Further, the first ground layer 150 is arranged closest to the winding portion in the thickness direction D1 of the mounting substrate 100 among ground layers formed in the region in the plurality of ground layers. The first ground layer 150 is overlapped with an inner region (for example, the inner region 301) formed on the inner side of the winding portion but is not overlapped with at least part of the winding portion in plan view of the mounting substrate 100.

Figure 6:
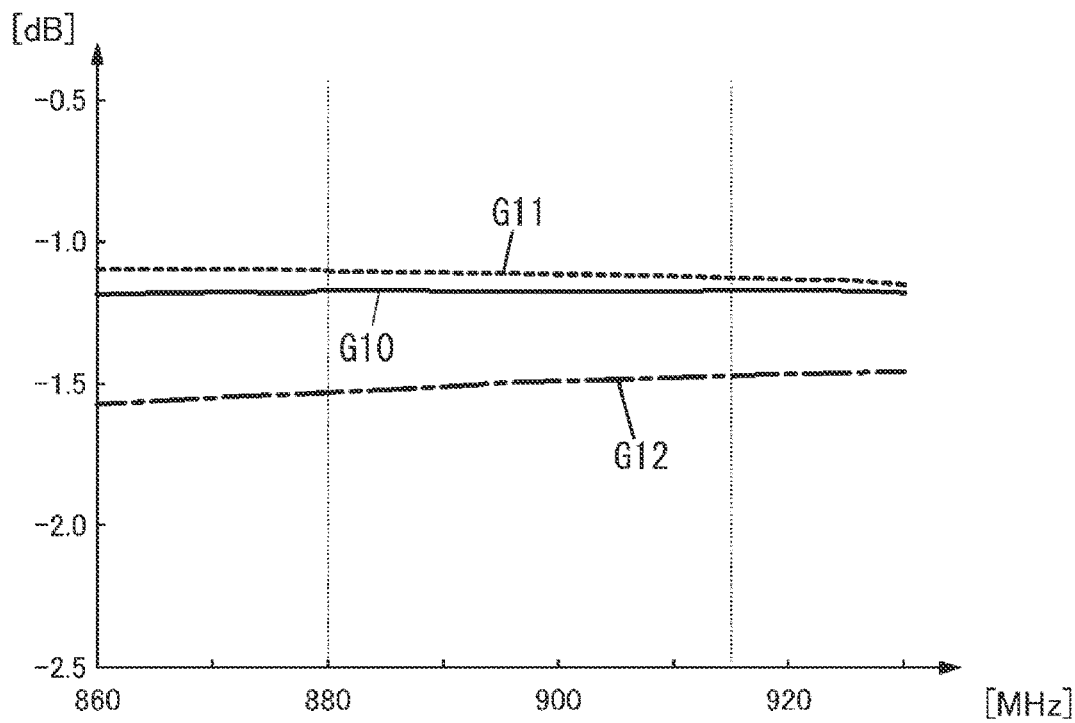
FIG. 6 is a frequency characteristics diagram for explaining signal attenuation occurring when the third matching circuit included in the high frequency module according to the embodiment outputs a first transmission signal.

FIG. 6 is a frequency characteristics diagram illustrating attenuation of the first transmission signal (Band 8 transmission signal) in outputting the first transmission signal. A line G10 indicates characteristics in attenuation of the first transmission signal obtained when the third matching circuit 71 according to the present embodiment (see FIG. 1) outputs the first transmission signal. A line G11 indicates characteristics in attenuation of the first transmission signal in a high frequency module (a high frequency module according to a first comparison example) that does not include the first ground layer 150 (see FIG. 5B). A line G12 indicates characteristics in attenuation of the first transmission signal in a high frequency module (a high frequency module according to a second comparison example) that includes a ground layer that is arranged to be overlapped with both of a winding portion and the inner side of the winding portion of an inductor, which is formed in the inside of a mounting substrate, in plan view of the mounting substrate.

In the high frequency module according to the first comparison example, the inductor that is formed in the inside of the mounting substrate and has the winding portion can reduce an influence of the ground layer. The high frequency module according to the second comparison example includes the ground layer that is arranged to be overlapped with both of the winding portion and the inner side of the winding portion of the inductor, which is formed in the inside of the mounting substrate, in plan view of the mounting substrate included in the high frequency module according to the second comparison example. Therefore, an influence of the ground layer cannot be reduced by the inductor having the winding portion which is formed in the inside of the mounting substrate included in the high frequency module according to the second comparison example. That is, a Q value of the inductor in the mounting substrate is lower in the high frequency module according to the second comparison example than in the high frequency module according to the first comparison example.

On the other hand, in the high frequency module 1 according to the present embodiment, the first ground layer 150, which is arranged closest to the winding portion in the thickness direction D1 of the mounting substrate 100, is formed on the inner side of the outer edge of the winding portion in plan view of the mounting substrate 100. Thus, the first ground layer 150 is overlapped with the inner region but is not overlapped with at least part of the winding portion 71a in plan view of the mounting substrate 100. Therefore, a Q value of the fifth inductor LS3 of the mounting substrate 100 can be improved in the high frequency module 1 according to the present embodiment compared to the high frequency module according to the second comparison example.

Figure 7:
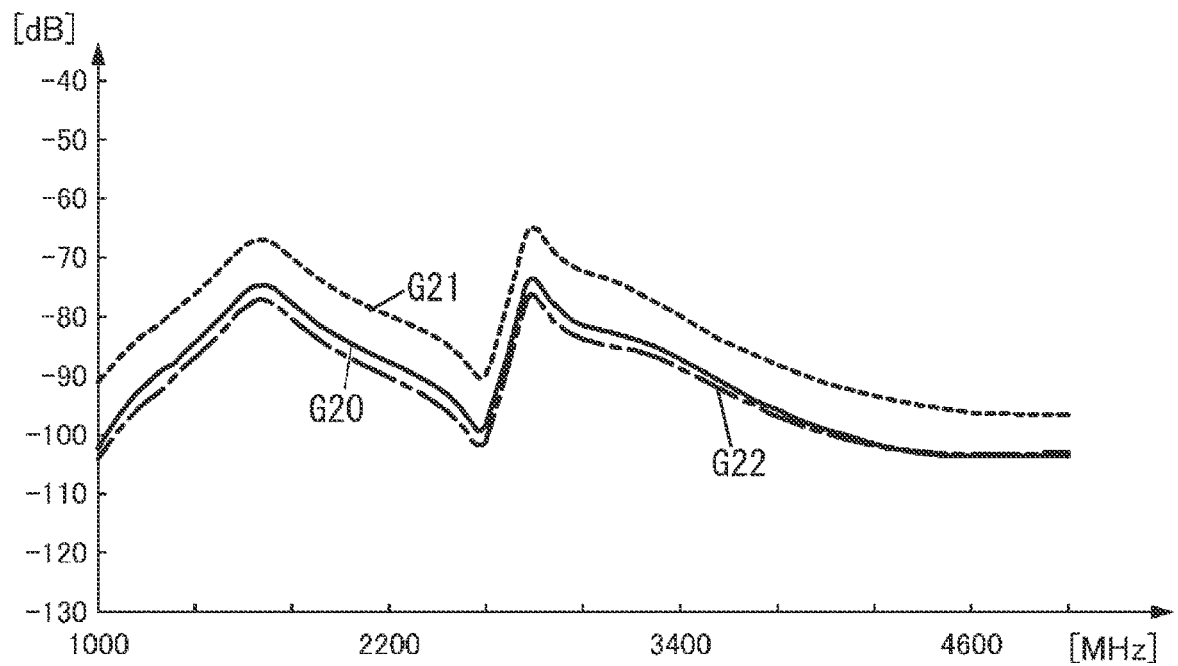
FIG. 7 is a frequency characteristics diagram obtained when harmonic components of the first transmission signal outputted from the high frequency module according to the embodiment wrap around an antenna.
Figure 8A:
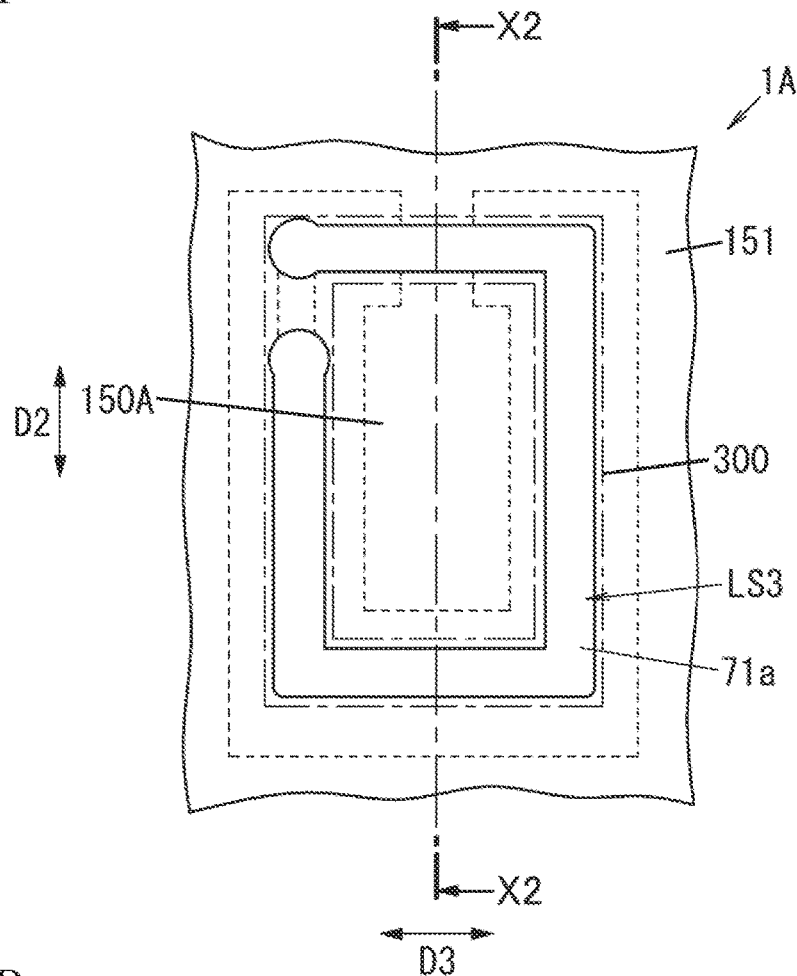
FIG. 8A is a plan view for explaining a positional relation between a winding portion of a fifth inductor included in a high frequency module according to a first modification and a first ground layer.
Figure 8B:
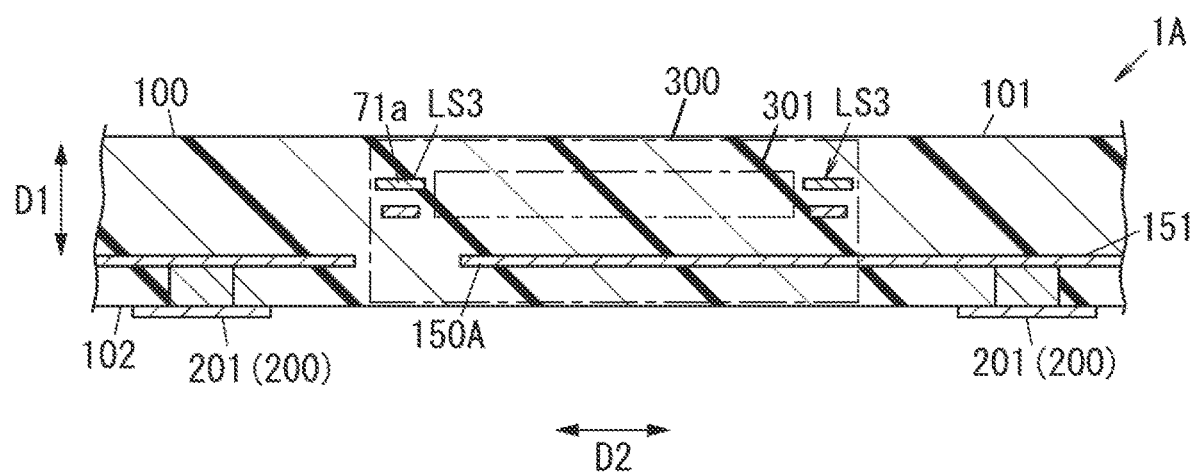
FIG. 8B is a sectional view, taken along an X2-X2 line of FIG. 8A, for explaining the positional relation between the winding portion of the fifth inductor according to the first modification and the first ground layer.

FIG. 7 is a characteristics diagram illustrating wraparound of harmonic components of the first transmission signal to the antenna 510, that is, attenuation of the harmonic components of the first transmission signal. A line G20 indicates attenuation of high frequency components of the first transmission signal in the high frequency module 1 according to the present embodiment. A line G21 indicates attenuation of high frequency components of the first transmission signal in the high frequency module according to the first comparison example. A line G22 indicates attenuation of high frequency components of the first transmission signal in the high frequency module according to the second comparison example.

The high frequency module according to the second comparison example includes the ground layer that is arranged to be overlapped with both of the winding portion and the inner side of the winding portion of the inductor, which is formed in the inside of the mounting substrate, in plan view of the mounting substrate, being able to reduce an influence of a magnetic field generated in this inductor. On the other hand, the high frequency module according to the first comparison example cannot reduce an influence of the magnetic field generated in the inductor, which is formed in the inside of the mounting substrate and has the winding portion, compared to the high frequency module according to the second comparison example. Therefore, in the high frequency module according to the first comparison example, there are more harmonic components of the first transmission signal wrapping around the antenna than in the high frequency module according to the second comparison example. That is, the high frequency module according to the first comparison example has more harmonic components of the first transmission signal than the high frequency module according to the second comparison example.

In the high frequency module 1 according to the present embodiment, the first ground layer 150, which is arranged closest to the winding portion 71a in the thickness direction D1 of the mounting substrate 100, is formed on the inner side of the outer edge of the winding portion 71a and accordingly, the first ground layer 150 is overlapped with the inner region 301 but is not overlapped with at least part of the winding portion 71a in plan view of the mounting substrate 100. Therefore, the high frequency module 1 according to the present embodiment can reduce an influence of a magnetic field generated in the fifth inductor LS3 of the mounting substrate 100 compared to the high frequency module according to the first comparison example. That is, as illustrated in FIG. 7, the high frequency module 1 according to the present embodiment can reduce harmonic components of the first transmission signal compared to the high frequency module according to the first comparison example, as is the case with the high frequency module according to the second comparison example. In other words, the high frequency module 1 according to the present embodiment can reduce wraparound of harmonic components to the antenna 510 compared to the high frequency module according to the first comparison example. Accordingly, the high frequency module 1 according to the present embodiment can suppress deterioration of frequency characteristics caused by an influence of a magnetic field generated in the fifth inductor LS3 of the mounting substrate 100 compared to the high frequency module according to the first comparison example, as is the case with the high frequency module according to the second comparison example.

As described thus far, the high frequency module 1 according to the present embodiment can reduce deterioration of frequency characteristics caused by an influence of a magnetic field generated in the fifth inductor LS3 while improving the Q value of the fifth inductor LS3 built in the mounting substrate 100. Here, the "inductor built in the mounting substrate" indicates an inductor at least a winding portion of which is built in the mounting substrate.

(3) Modification

Modifications according to the embodiment will now be described.

(3.1) First Modification

In the high frequency module 1 according to the embodiment, the first ground layer 150 is not limitedly configured to be connected with the ground terminal 201 that is overlapped with the first ground layer 150 in plan view of the mounting substrate 100. The first ground layer 150 may be connected with the ground terminal 201 via another ground layer.

In a high frequency module 1A according to a first modification, a first ground layer 150A is connected with the ground terminal 201 via another ground layer (for example, the second ground layer 151). The first ground layer 150A and the second ground layer 151 are positioned on the same layer in the thickness direction D1 of the mounting substrate 100 included in the high frequency module 1A, in the first modification. One end of the first ground layer 150A, for example, one end in a direction D2, which intersects with (is orthogonal to) the thickness direction D1 of the mounting substrate 100, is connected with the second ground layer 151 (see FIGS. 8A and 8B), in the first modification. That is, the first ground layer 150A of the first modification is formed on the inner side of the outer edge of the winding portion 71a in plan view of the mounting substrate 100 and further, the first ground layer 150A is arranged closest to the winding portion 71a in the thickness direction D1 of the mounting substrate 100. Also, the first ground layer 150A of the first modification is overlapped with the inner region 301 formed on the inner side of the winding portion 71a but is not overlapped with at least part of the winding portion 71a in plan view of the mounting substrate 100. Here, FIG. 8A omits illustration of one or more dielectric layers and one or more conductive layers that are between the winding portion 71a of the fifth inductor LS3 and the first main surface 101 of the mounting substrate 100. Further, FIG. 8B omits illustration of electronic components arranged on the first main surface 101 of the mounting substrate 100 and illustration of electronic components (for example, the second switch 61 and the third switch 62) arranged on the second main surface 102 of the mounting substrate 100.

The first ground layer 150A of the first modification is connected with the second ground layer 151, thereby being connected with the ground terminal 201 via the second ground layer 151.

Figure 9:
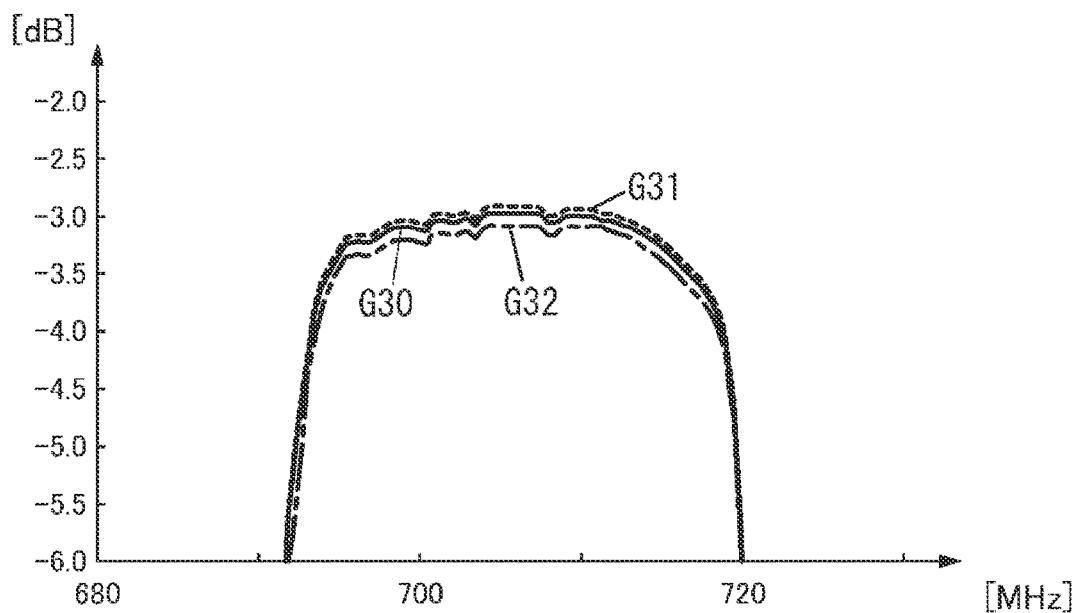
FIG. 9 is a frequency characteristics diagram for explaining attenuation of a second transmission signal in the high frequency module according to the first modification.

FIG. 9 is a frequency characteristics diagram illustrating attenuation of the second transmission signal (Band 12 transmission signal) in outputting the second transmission signal. A line G30 indicates characteristics in attenuation of the second transmission signal obtained when the third matching circuit 71 of the high frequency module 1A outputs the second transmission signal. A line G31 indicates characteristics in attenuation of the second transmission signal in the high frequency module according to the first comparison example described above. A line G32 indicates characteristics in attenuation of the second transmission signal in the high frequency module according to the second comparison example described above.

In the high frequency module according to the first comparison example, the inductor formed in the inside of the mounting substrate can reduce an influence of the ground layer. In the high frequency module according to the second comparison example, an influence of the ground layer cannot be reduced by the inductor formed in the inside of the mounting substrate included in the high frequency module according to the second comparison example, as described above. That is, a Q value of the inductor formed in the inside of the mounting substrate is lower in the high frequency module according to the second comparison example than in the high frequency module according to the first comparison example.

On the other hand, in the high frequency module 1A, the first ground layer 150A, which is arranged closest to the winding portion in the thickness direction D1 of the mounting substrate 100, is formed on the inner side of the outer edge of the winding portion and accordingly, the first ground layer 150A is overlapped with the inner region 301 but is not overlapped with at least part of the winding portion 71a in plan view of the mounting substrate 100. Therefore, the high frequency module 1A according to the first modification can improve the Q value of the fifth inductor LS3 formed in the inside of the mounting substrate 100 compared to the high frequency module according to the second comparison example.

Figure 10:
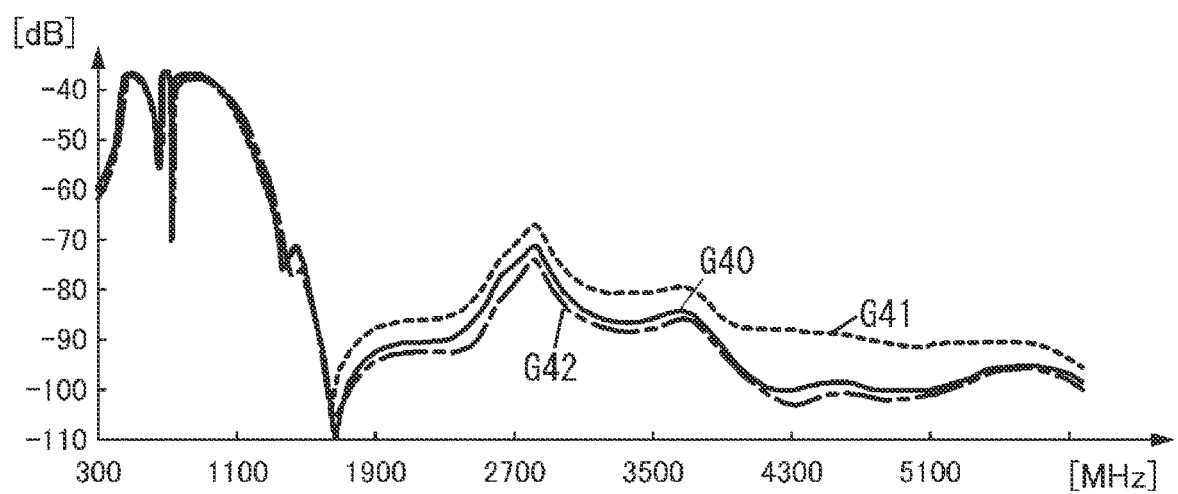
FIG. 10 is a frequency characteristics diagram for explaining attenuation of harmonic components of the second transmission signal in the high frequency module according to the first modification.

FIG. 10 is a characteristics diagram illustrating wraparound of harmonic components of the second transmission signal to the antenna 510, that is, attenuation of the harmonic components of the second transmission signal. A line G40 indicates attenuation of high frequency components of the second transmission signal in the high frequency module 1A. A line G41 indicates attenuation of high frequency components of the second transmission signal in the high frequency module according to the first comparison example. A line G42 indicates attenuation of high frequency components of the second transmission signal in the high frequency module according to the second comparison example.

The high frequency module according to the second comparison example can reduce an influence of a magnetic field generated in the inductor formed in the inside of the mounting substrate, as mentioned above. On the other hand, the high frequency module according to the first comparison example cannot reduce an influence of the magnetic field generated in the inductor formed in the inside of the mounting substrate, compared to the high frequency module according to the second comparison example. Therefore, in the high frequency module according to the first comparison example, there are more harmonic components of the second transmission signal wrapping around the antenna than in the high frequency module according to the second comparison example. That is, the high frequency module according to the first comparison example has more harmonic components of the second transmission signal than the high frequency module according to the second comparison example.

In the high frequency module 1A, the first ground layer 150A, which is arranged closest to the winding portion 71a in the thickness direction D1 of the mounting substrate 100, is formed on the inner side of the outer edge of the winding portion 71a and accordingly, the first ground layer 150A is overlapped with the inner region 301 but is not overlapped with at least part of the winding portion 71a in plan view of the mounting substrate 100. Therefore, the high frequency module 1A according to the first modification can reduce an influence of a magnetic field generated in the fifth inductor LS3 formed in the inside of the mounting substrate 100 compared to the high frequency module according to the first comparison example. That is, as illustrated in FIG. 10, the high frequency module 1A according to the first modification can reduce harmonic components of the second transmission signal compared to the high frequency module according to the first comparison example, as is the case with the high frequency module according to the second comparison example. In other words, the high frequency module 1A according to the first modification can reduce wraparound of harmonic components to the antenna 510 compared to the high frequency module according to the first comparison example. Accordingly, the high frequency module 1A according to the first modification can suppress deterioration of frequency characteristics compared to the high frequency module according to the first comparison example, as is the case with the high frequency module according to the second comparison example.

Here, the high frequency module 1A can obtain similar characteristics to those of the line G10 illustrated in FIG. 6 and the line G20 illustrated in FIG. 7 in transmitting the first transmission signal. Also, the high frequency module 1 described in the embodiment can obtain similar characteristics to those of the line G30 illustrated in FIG. 9 and the line G40 illustrated in FIG. 10 in transmitting the second transmission signal.

Figure 11:
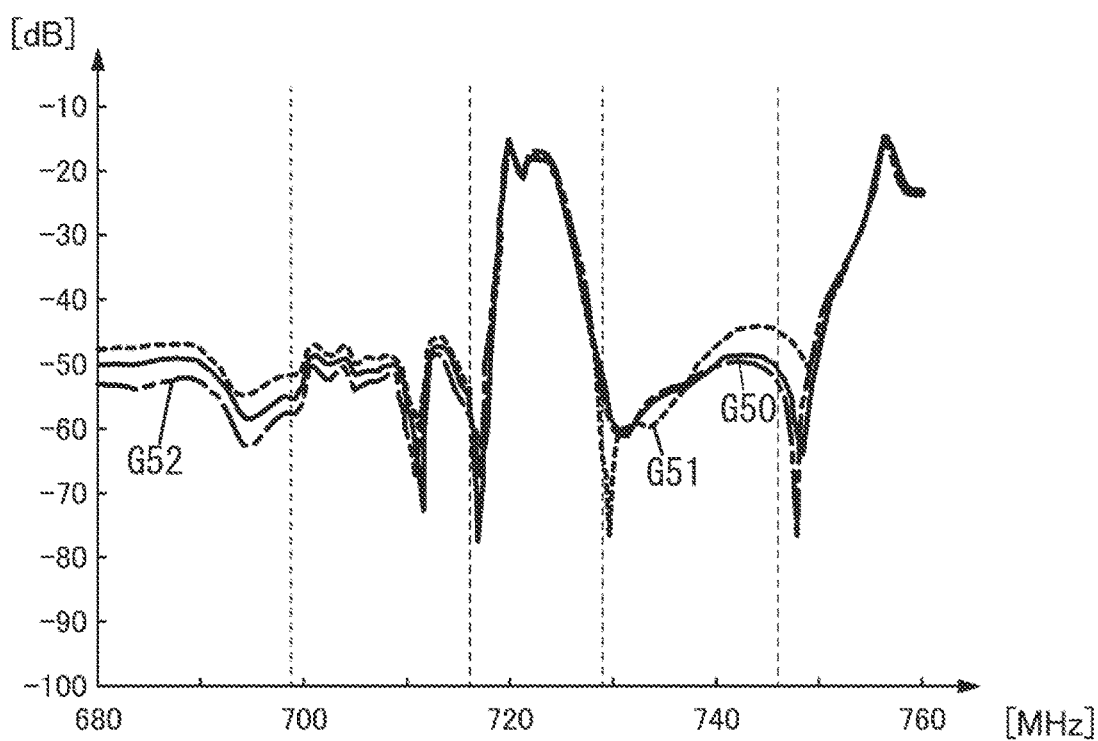
FIG. 11 is a frequency characteristics diagram for explaining isolation between the second transmission signal and a reception signal in the high frequency module according to the first modification.
Figure 12A:
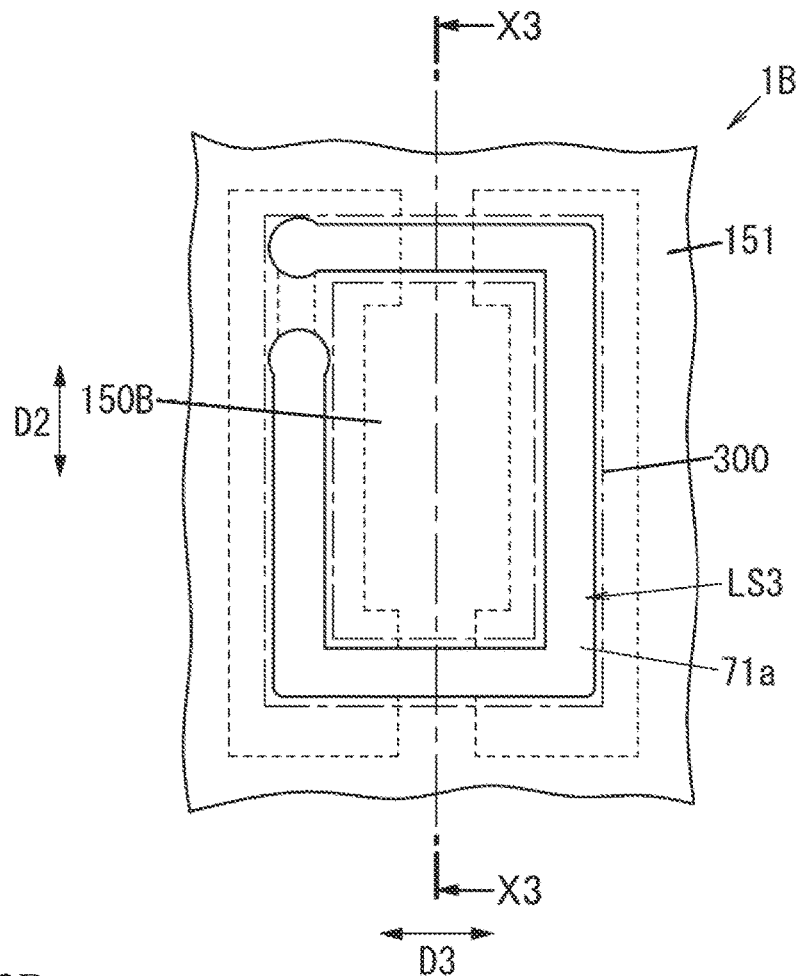
FIG. 12A is a plan view for explaining a positional relation between a winding portion of a fifth inductor included in a high frequency module according to a second modification and a first ground layer.
Figure 12B:
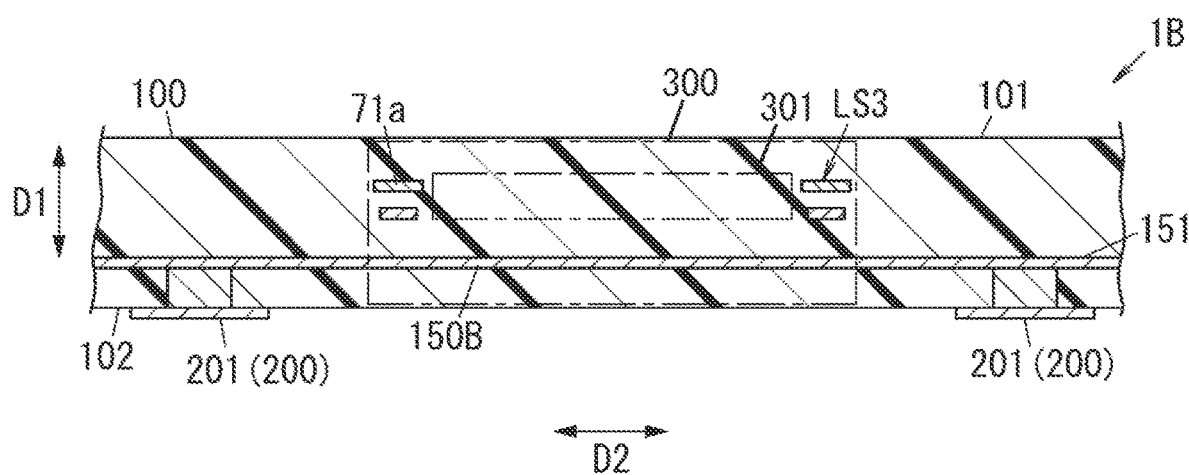
FIG. 12B is a sectional view, taken along an X3-X3 line of FIG. 12A, for explaining the positional relation between the winding portion of the fifth inductor according to the second modification and the first ground layer.

FIG. 11 is a characteristics diagram illustrating frequency characteristics in transmission and reception in Band 12. A line G50 indicates frequency characteristics of the high frequency module 1A in transmission and reception in Band 12. A line G51 indicates frequency characteristics of the high frequency module according to the first comparison example described above in transmission and reception in Band 12. A line G52 indicates frequency characteristics of the high frequency module according to the second comparison example described above in transmission and reception in Band 12.

As can be seen from FIG. 11, isolation in a transmission band (699 MHz to 716 MHz) of the Band 12 and a reception band (729 MHz to 746 MHz) of the Band 12 is improved in the high frequency module 1A compared to the high frequency module according to the first comparison example, as is the case with the high frequency module according to the second comparison example.

The high frequency module 1 described in the embodiment can also obtain similar characteristics as those of the line G50. Therefore, isolation is improved also in the high frequency module 1 according to the embodiment compared to the high frequency module according to the first comparison example.

(3.2) Second Modification

In a high frequency module 1B according to a second modification, a method of connection with the second ground layer 151 is different from that in the first modification. Both ends of a first ground layer 150B, for example, both ends in the direction D2 of the mounting substrate 100 are connected with the second ground layer 151 (see FIGS. 12A and 12B), in the second modification. That is, the first ground layer 150B of the second modification is formed on the inner side of the outer edge of the winding portion 71a in plan view of the mounting substrate 100 and further, the first ground layer 150B is arranged closest to the winding portion 71a in the thickness direction D1 of the mounting substrate 100. Also, the first ground layer 150B of the second modification is overlapped with the inner region 301 formed on the inner side of the winding portion 71a but is not overlapped with at least part of the winding portion 71a in plan view of the mounting substrate 100. Here, FIG. 12A omits illustration of one or more dielectric layers and one or more conductive layers that are between the winding portion 71a of the fifth inductor LS3 and the first main surface 101 of the mounting substrate 100. Further, FIG. 12B omits illustration of electronic components arranged on the first main surface 101 of the mounting substrate 100 and illustration of electronic components (for example, the second switch 61 and the third switch 62) arranged on the second main surface 102 of the mounting substrate 100.

The first ground layer 150B of the second modification is connected with the second ground layer 151, thereby being connected with the ground terminal 201 via the second ground layer 151, as is the case with the first modification.

Here, the first ground layer 150B in the direction D2 of the mounting substrate 100 may be connected with the second ground layer 151 in a direction D3 that intersects with (is orthogonal to) both of the thickness direction D1 and the direction D2 of the mounting substrate 100.

The second modification can also obtain similar characteristics to those of the line G10 illustrated in FIG. 6 and the line G20 illustrated in FIG. 7 in transmitting the first transmission signal. Also, the second modification can obtain similar characteristics to those of the line G30 illustrated in FIG. 9 and the line G40 illustrated in FIG. 10 in transmitting the second transmission signal. Further, the second modification can also obtain similar characteristics as those of the line G50 illustrated in FIG. 11. Therefore, isolation in the high frequency module 1B according to the second modification is improved compared to the high frequency module according to the first comparison example.

(3.3) Third Modification

In a high frequency module 1C according to a third modification, the method of connection with the second ground layer 151 is different from that in the first modification and the second modification. A first ground layer 150C is connected with the second ground layer 151 via another ground layer which is not positioned on the same layer, in the third modification. That is, the first ground layer 150C of the third modification is formed on the inner side of the outer edge of the winding portion 71a in plan view of the mounting substrate 100 and further, the first ground layer 150C is arranged closest to the winding portion 71a in the thickness direction D1 of the mounting substrate 100. Also, the first ground layer 150C of the third modification is overlapped with the inner region 301 formed on the inner side of the winding portion 71a but is not overlapped with at least part of the winding portion 71a in plan view of the mounting substrate 100.

Figure 13:
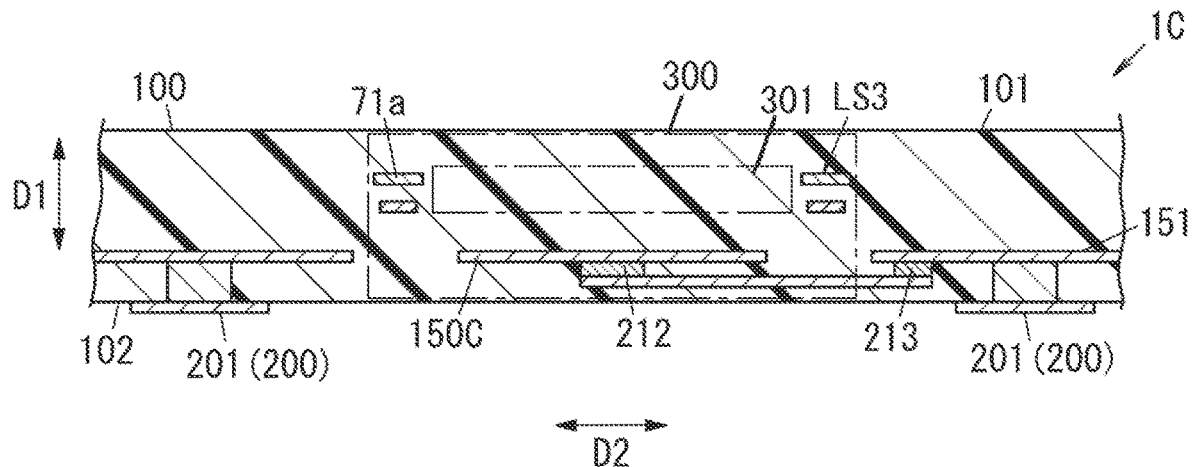
FIG. 13 is a sectional view for explaining a positional relation between a winding portion of a fifth inductor included in a high frequency module according to a third modification and a first ground layer.

For example, in the high frequency module 1C, the first ground layer 150C is connected with a third ground layer 152 through a via conductor 212 (see FIG. 13). The third ground layer 152 is provided on the side closer to the second main surface 102 of the mounting substrate 100 with respect to the first ground layer 150. The third ground layer 152 is connected with the second ground layer 151 through a via conductor 213 (see FIG. 13). That is, the first ground layer 150C is connected with the second ground layer 151 via the third ground layer 152. In short, the first ground layer 150C is connected with the ground terminal 201 via the third ground layer 152 and the second ground layer 151. Here, FIG. 13 omits illustration of electronic components arranged on the first main surface 101 of the mounting substrate 100 and illustration of electronic components (for example, the second switch 61 and the third switch 62) arranged on the second main surface 102 of the mounting substrate 100.

The third modification can also obtain similar characteristics to those of the line G10 illustrated in FIG. 6 and the line G20 illustrated in FIG. 7 in transmitting the first transmission signal. Also, the third modification can obtain similar characteristics to those of the line G30 illustrated in FIG. 9 and the line G40 illustrated in FIG. 10 in transmitting the second transmission signal. Further, the third modification can also obtain similar characteristics as those of the line G50 illustrated in FIG. 11. Therefore, isolation in the high frequency module 1C according to the third modification is improved compared to the high frequency module according to the first comparison example.

(3.4) Fourth Modification

In the embodiment, the first ground layer 150 is not limitedly configured to be formed in the inside of the mounting substrate 100.

Figure 14:
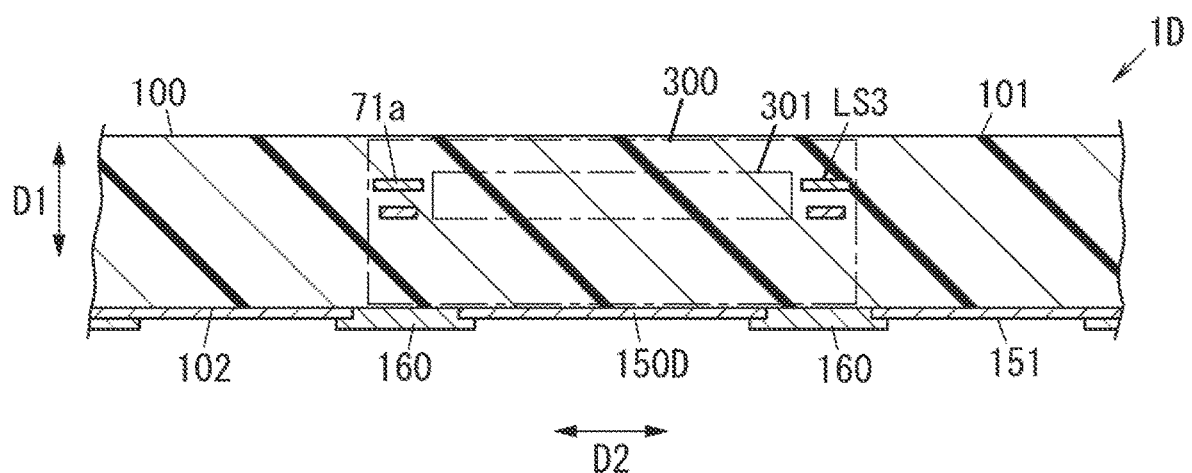
FIG. 14 is a sectional view for explaining a positional relation between a winding portion of a fifth inductor included in a high frequency module according to a fourth modification and a first ground layer.

In a high frequency module 1D according to a fourth modification, a first ground layer 150D is arranged on the second main surface 102 of the mounting substrate 100 included in the high frequency module 1D (see FIG. 14). The first ground layer 150D and the second ground layer 151 are arranged on the second main surface 102 of the mounting substrate 100 in the fourth modification. That is, the first ground layer 150D of the fourth modification is formed on the inner side of the outer edge of the winding portion 71a in plan view of the mounting substrate 100 and further, the first ground layer 150D is arranged closest to the winding portion 71a in the thickness direction D1 of the mounting substrate 100. Also, the first ground layer 150D of the fourth modification is overlapped with the inner region 301 formed on the inner side of the winding portion 71a but is not overlapped with at least part of the winding portion 71a in plan view of the mounting substrate 100. Here, FIG. 14 omits illustration of electronic components arranged on the first main surface 101 of the mounting substrate 100 and illustration of electronic components (for example, the second switch 61 and the third switch 62) arranged on the second main surface 102 of the mounting substrate 100.

The first ground layer 150D of the fourth modification is formed on the inner side of the region 300 formed by the outer edge of the winding portion 71a of the fifth inductor LS3 in plan view of the mounting substrate 100 and accordingly, the first ground layer 150D is overlapped with the inner region 301 formed on the inner side of the winding portion 71a but is not overlapped with at least part of the winding portion 71a, as is the case with the embodiment.

The mounting substrate 100 of the high frequency module 1D according to the fourth modification includes a resist 160. The resist 160 is an insulating film made of resin and is provided on the second main surface 102 of the mounting substrate 100. More specifically, the resist 160 is provided on the second main surface 102 of the mounting substrate 100 so as to expose part of each of the first ground layer 150D and the second ground layer 151.

Figure 15:
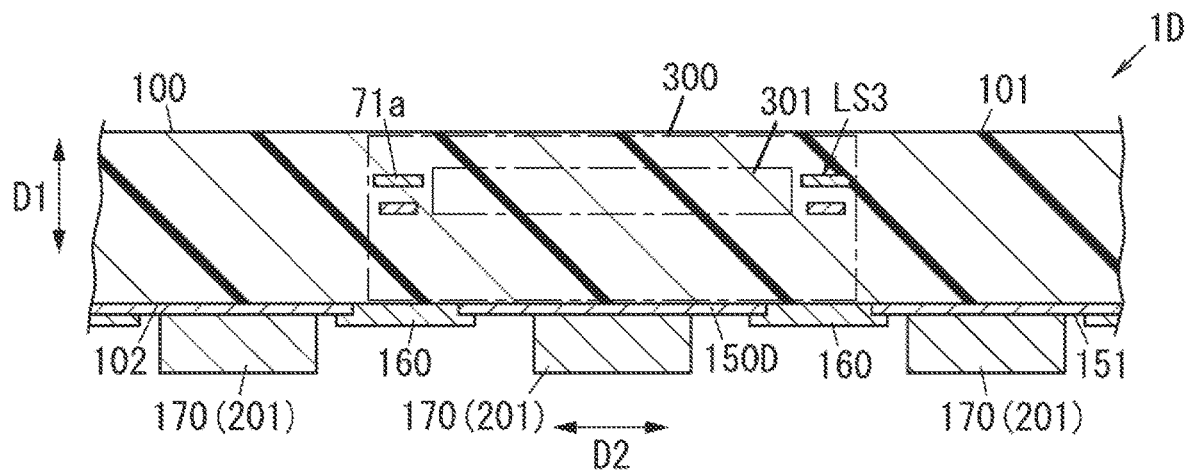
FIG. 15 is a sectional view for explaining a positional relation between a winding portion of a fifth inductor and a first ground layer in another example of the fourth modification.

Further, in the high frequency module 1D according to the fourth modification, a pillar 170 or a solder bump serving as the ground terminal 201 may be provided on the first ground layer 150D and the second ground layer 151, as illustrated in FIG. 15. Here, FIG. 15 omits illustration of electronic components arranged on the first main surface 101 of the mounting substrate 100 and illustration of electronic components (for example, the second switch 61 and the third switch 62) arranged on the second main surface 102 of the mounting substrate 100.

The fourth modification can also obtain similar characteristics to those of the line G10 illustrated in FIG. 6 and the line G20 illustrated in FIG. 7 in transmitting the first transmission signal. Also, the fourth modification can obtain similar characteristics to those of the line G30 illustrated in FIG. 9 and the line G40 illustrated in FIG. 10 in transmitting the second transmission signal. Further, the fourth modification can also obtain similar characteristics as those of the line G50 illustrated in FIG. 11. Therefore, isolation in the high frequency module 1D according to the fourth modification is improved compared to the high frequency module according to the first comparison example.

(3.5) Fifth Modification

In the embodiment and the first to fourth modifications, respective first ground layers 150 and 150A to 150D are not limitedly configured to be arranged on the second main surface 102 side of the mounting substrate 100 with respect to the fifth inductor LS3.

Each of the first ground layers 150 and 150A to 150D may be arranged in the inside of the mounting substrate 100 on the side closer to the first main surface 101 with respect to the fifth inductor LS3 or arranged on the first main surface 101.

Alternatively, each of the first ground layers 150 and 150A to 150D may be arranged on both of the first main surface 101 side of the mounting substrate 100 and the second main surface 102 side of the mounting substrate 100 with respect to the fifth inductor LS3.

(3.6) Sixth Modification

The first ground layer 150 may be formed on the inner side of a region, which is formed by an outer edge of a winding portion included in any one of the first inductor LT1, the second inductor LT11, the third inductor LT12, and the fourth inductor LT4, in plan view of the mounting substrate 100 so that the first ground layer 150 is overlapped with an inner region formed on the inner side of this winding portion but is not overlapped with at least part of this winding portion.

(3.7) Seventh Modification

With respect to an inductor included in a balun provided to the power amplifier 81, the first ground layer 150 may be formed on the inner side of a region, which is formed by an outer edge of a winding portion of this inductor, in plan view of the mounting substrate 100 so that the first ground layer 150 is overlapped with an inner region formed on the inner side of this winding portion but is not overlapped with at least part of this winding portion.

Alternatively, with respect to an inductor included in a transformer provided to the power amplifier 81, the first ground layer 150 may be formed on the inner side of a region, which is formed by an outer edge of a winding portion of this inductor, in plan view of the mounting substrate 100 so that the first ground layer 150 is overlapped with an inner region formed on the inner side of this winding portion but is not overlapped with at least part of this winding portion.

(3.8) Eighth Modification

The inductor of the first matching circuit 41 may be formed in the inside of the mounting substrate 100. In other words, the inductor of the first matching circuit 41 may be a helically-structured inductor formed in the inside of the mounting substrate 100. In this configuration, the first ground layer 150 is formed on the inner side of a region, which is formed by an outer edge of a winding portion of the inductor of the first matching circuit 41, in plan view of the mounting substrate 100 so that the first ground layer 150 is overlapped with an inner region formed on the inner side of this winding portion but is not overlapped with at least part of this winding portion. Each of the first inductor LT1, the second inductor LT11, the third inductor LT12, the fourth inductor LT4, and the fifth inductor LS3 of the third matching circuit 71 may be a chip inductor in this configuration.

Each of the first inductor LT1, the second inductor LT11, the third inductor LT12, the fourth inductor LT4, and the fifth inductor LS3 of the third matching circuit 71 may be a chip inductor, and each of the inductors LA1 to LA3 of the low pass filter 20 may be a helically-structured inductor formed in the inside of the mounting substrate 100. The first ground layer 150 is formed on the inner side of a region, which is formed by an outer edge of a winding portion of any one of the inductors LA1 to LA3 of the low pass filter 20, in plan view of the mounting substrate 100 so that the first ground layer 150 is overlapped with an inner region formed on the inner side of this winding portion but is not overlapped with at least part of this winding portion.

Each of the first inductor LT1, the second inductor LT11, the third inductor LT12, the fourth inductor LT4, and the fifth inductor LS3 of the third matching circuit 71 may be a chip inductor, and the inductor of the fourth matching circuit 72 may be a helically-structured inductor formed in the inside of the mounting substrate 100. The first ground layer 150 is formed on the inner side of a region, which is formed by an outer edge of a winding portion of the inductor of the fourth matching circuit 72, in plan view of the mounting substrate 100 so that the first ground layer 150 is overlapped with an inner region formed on the inner side of this winding portion but is not overlapped with at least part of this winding portion.

Each of the first inductor LT1, the second inductor LT11, the third inductor LT12, the fourth inductor LT4, and the fifth inductor LS3 of the third matching circuit 71 may be a chip inductor, and the inductor of the second matching circuit 42 may be a helically-structured inductor formed in the inside of the mounting substrate 100. The first ground layer 150 is formed on the inner side of a region, which is formed by an outer edge of a winding portion of the inductor of the second matching circuit 42, in plan view of the mounting substrate 100 so that the first ground layer 150 is overlapped with an inner region formed on the inner side of this winding portion but is not overlapped with at least part of this winding portion.

(3.9) Ninth Modification

The second switch 61 is not limitedly configured to be arranged on the second main surface 102 of the mounting substrate 100. The second switch 61 may be arranged on the first main surface 101 of the mounting substrate 100. In a similar manner, the third switch 62 may be arranged on the first main surface 101 of the mounting substrate 100.

Further, the first switch 30 is not limitedly configured to be arranged on the first main surface 101 of the mounting substrate 100. The first switch 30 may be arranged on the second main surface 102 of the mounting substrate 100.

At least two switches, which are arranged on the same main surface (the first main surface 101 or the second main surface 102) of the mounting substrate 100, among the first switch 30, the second switch 61, and the third switch 62 may be provided as one chip.

(3.10) Tenth Modification

The fifth inductor LS3 is configured to be formed in the inside of the mounting substrate 100. However, the fifth inductor LS3 is not limitedly configured to be formed in the inside of the mounting substrate 100. It is enough that the winding portion 71*a* included in the fifth inductor LS3 is formed in the inside of the mounting substrate 100. That is, at least part of a conductor pattern portion that connects an electronic component (the second switch 61 in this example), which is to be connected with the fifth inductor LS3, with the winding portion 71*a* may be provided on a surface layer (for example, the first main surface 101).

In a similar manner, the first inductor LT1, the second inductor LT11, the third inductor LT12, and the fourth inductor LT4 are configured to be formed in the inside of the mounting substrate 100. However, the first inductor LT1, the second inductor LT11, the third inductor LT12, and the fourth inductor LT4 are not limitedly configured to be formed in the inside of the mounting substrate 100. It is enough that the winding portion included in each of the first inductor LT1, the second inductor LT11, the third inductor LT12, and the fourth inductor LT4 is formed in the inside of the mounting substrate 100. That is, at least part of a conductor pattern portion for an electronic component to be connected with the winding portion of each of the first inductor LT1, the second inductor LT11, the third inductor LT12, and the fourth inductor LT4 may be provided on a surface layer (for example, the first main surface 101).

SUMMARY

As described above, a high frequency module (1; 1A; 1B; 1C; 1D) according to a first aspect includes a mounting substrate (100), an inductor (for example, the fifth inductor LS3), and a plurality of electronic components (for example, the low pass filter 20 and the low noise amplifier 82). The mounting substrate (100) has a first main surface (101) and a second main surface (102) that are opposed to each other. The inductor is arranged on the mounting substrate (100). The plurality of electronic components are arranged on the first main surface (101) of the mounting substrate (100). The inductor is arranged in an inside of the mounting substrate (100) and has a winding portion (for example, the winding portion 71*a*) that is formed by winding a conductor portion (a conductor pattern portion, a via conductor portion) a plurality of times in a thickness direction (D1) of the mounting substrate (100). The mounting substrate (100) includes a plurality of ground layers including at least a first ground layer (150; 150A; 150B; 150C; 150D) and a second ground layer (151). The first ground layer (150; 150A; 150B; 150C; 150D) is formed in a region (for example, the region 300) that is on the inner side of an outer edge of the winding portion in plan view of the mounting substrate (100). Further, the first ground layer (150; 150A; 150B; 150C; 150D) is arranged closest to the winding portion in the thickness direction (D1) of the mounting substrate (100) among ground layers formed in the region in the plurality of ground layers. The first ground layer (150; 150A; 150B; 150C; 150D) is overlapped with an inner region (for example, the inner region 301) formed on the inner side of the winding portion but is not overlapped with at least part of the winding portion in plan view of the mounting substrate (100).

According to this configuration, the first ground layer (150; 150A; 150B; 150C; 150D) is overlapped with the inner region, which is formed on the inner side of the winding portion, but is not overlapped with at least part of the winding portion in plan view of the mounting substrate (100). Accordingly, the configuration can suppress deterioration in a Q value of the inductor of the mounting substrate (100) compared to the high frequency module according to the second comparison example described above. Further, the first ground layer (150; 150A; 150B; 150C; 150D) is formed on the inner side of the outer edge of the winding portion in plan view of the mounting substrate (100), thereby being able to reduce an influence of the magnetic field generated in the inductor of the mounting substrate (100). As a result, an influence of a magnetic field generated in the inductor of the mounting substrate (100) can be reduced compared to the high frequency module according to the first comparison example described above. Thus, this configuration can suppress deterioration of frequency characteristics which is caused by an influence of a magnetic field generated in an inductor built in the mounting substrate (100) while improving a Q value of the inductor.

In the high frequency module (1; 1A; 1B; 1C; 1D) according to a second aspect, the plurality of electronic components include a chip inductor in the first aspect. The inductor is included in a matching circuit that is connected with an output terminal of a power amplifier (81).

According to this configuration, the inductor of the matching circuit that performs impedance matching of a transmission signal outputted from the power amplifier (81) is formed in the inside of the mounting substrate (100), being able to suppress signal jump between the inductor and the chip inductor arranged on the first main surface (101) of the mounting substrate (100).

In the high frequency module (1; 1A; 1B; 1C; 1D) according to a third aspect, the chip inductor is one of elements constituting a low pass filter that is arranged between a filter, which passes a transmission signal, and an antenna terminal, in the second aspect.

This configuration can prevent a transmission signal from jumping to the low pass filter (20).

In the high frequency module (1; 1A; 1B; 1C; 1D) according to a fourth aspect, the chip inductor is included in a matching circuit that is connected with an input terminal of a low noise amplifier, in the second aspect.

This configuration can prevent a transmission signal from jumping to the low noise amplifier (82).

The high frequency module (1; 1D) according to a fifth aspect further includes a ground terminal (201) in any one of the first to fourth aspects. The ground terminal (201) is overlapped with the first ground layer (150; 150D) in plan view of the mounting substrate (100) and is connected with the first ground layer (150; 150D).

This configuration can improve a shielding effect while making it possible to arrange the ground terminal (201) on a position overlapped with the first ground layer (150; 150D) in plan view of the mounting substrate (100).

In the high frequency module (1; 1C; 1D) according to a sixth aspect, the first ground layer (150; 150C; 150D) is not overlapped with a whole of the winding portion in any one of the first to fifth aspects.

According to this configuration, the first ground layer (150; 150C; 150D) is not overlapped with the whole of the winding portion, being able to improve a Q value of the inductor.

A communication device (500) according to a seventh aspect is provided with the high frequency module (1; 1A; 1B; 1C; 1D) according to any one of the first to sixth aspects and a signal processing circuit (501). The signal processing circuit (501) processes a high frequency signal passing through the high frequency module (1; 1A; 1B; 1C; 1D).

This configuration can suppress deterioration of frequency characteristics which is caused by an influence of a magnetic field generated in an inductor built in the mounting substrate (100) while improving a Q value of the inductor.

What is claimed is:

1. A high frequency module comprising:
    a mounting substrate having a first main surface and a second main surface, the first main surface and the second main surface being opposed to each other;
    an inductor arranged on the mounting substrate; and
    a plurality of electronic components arranged on the first main surface of the mounting substrate;
    a ground terminal overlapped with a first ground layer in a plan view of the mounting substrate and connected with the first ground layer, wherein:
    the inductor is arranged in an inside of the mounting substrate and has a winding portion having a conductor portion wound a plurality of times in a thickness direction of the mounting substrate,
    the mounting substrate includes a plurality of ground layers including at least the first ground layer and a second ground layer,
    the first ground layer is provided in a region being on an inner side of an outer edge of the winding portion in the plan view of the mounting substrate, and the first ground layer is arranged closest to the winding portion in the thickness direction of the mounting substrate among ground layers provided in the region in the plurality of ground layers, and
    the first ground layer is overlapped with an inner region provided on an inner side of the winding portion but is not overlapped with at least part of the winding portion in the plan view of the mounting substrate.

2. The high frequency module according to claim 1, wherein
    the plurality of electronic components include a chip inductor, and
    the inductor is included in a matching circuit connected with an output terminal of a power amplifier.

3. The high frequency module according to claim 2, wherein the chip inductor is one of elements constituting a low pass filter arranged between a filter, the filter passing a transmission signal, and an antenna terminal.

4. The high frequency module according to claim 3, wherein the first ground layer is not overlapped with a whole of the winding portion.

5. A communication device comprising:
    the high frequency module according to claim 3; and
    a signal processing circuit configured to process a high frequency signal passing through the high frequency module.

6. The high frequency module according to claim 2, wherein the chip inductor is included in a matching circuit connected with an input terminal of a low noise amplifier.

7. The high frequency module according to claim 6, wherein the first ground layer is not overlapped with a whole of the winding portion.

8. A communication device comprising:
    the high frequency module according to claim 6; and
    a signal processing circuit configured to process a high frequency signal passing through the high frequency module.

9. The high frequency module according to claim 2, wherein the first ground layer is not overlapped with a whole of the winding portion.

10. A communication device comprising:
    the high frequency module according to claim 2; and
    a signal processing circuit configured to process a high frequency signal passing through the high frequency module.

11. The high frequency module according to claim 1, wherein the first ground layer is not overlapped with a whole of the winding portion.

12. A communication device comprising:
    the high frequency module according to claim 11; and
    a signal processing circuit configured to process a high frequency signal passing through the high frequency module.

13. A communication device comprising:
    the high frequency module according to claim 1; and
    a signal processing circuit configured to process a high frequency signal passing through the high frequency module.

* * * * *